(12) United States Patent
Vega et al.

(10) Patent No.: US 12,727,179 B2
(45) Date of Patent: Sep. 1, 2026

(54) TRENCH CAPACITOR IN BACKSIDE DIFFUSION BREAK

(71) Applicant: INTERNATIONAL BUSINESS MACHINES CORPORATION, Armonk, NY (US)

(72) Inventors: Reinaldo Vega, Mahopac, NY (US); Ruilong Xie, Niskayuna, NY (US); Nicholas Anthony Lanzillo, Wynantskill, NY (US); Takashi Ando, Eastchester, NY (US); David Wolpert, Poughkeepsie, NY (US); James P Mazza, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 365 days.

(21) Appl. No.: 18/610,417

(22) Filed: Mar. 20, 2024

(65) Prior Publication Data

US 2025/0301674 A1 Sep. 25, 2025

(51) Int. Cl.
*H01L 29/94* (2006.01)
*H01L 29/06* (2006.01)
(Continued)

(52) U.S. Cl.
CPC ............. *H10D 1/665* (2025.01); *H10D 30/43* (2025.01); *H10D 30/6729* (2025.01);
(Continued)

(58) Field of Classification Search
CPC .......... H10D 1/665; H10D 1/66; H10D 1/692; H10D 1/047; H10D 30/43; H10D 30/6729; H10D 30/67; H10D 30/6735; H10D 30/6757; H10D 30/6708; H10D 30/6715; H10D 30/014; H10D 30/01; H10D 62/121; H10D 62/10; H10D 62/151; H10D 62/116;
(Continued)

(56) References Cited

U.S. PATENT DOCUMENTS

| | | | |
|---|---|---|---|
| 8,294,240 | B2 | 10/2012 | Nowak |
| 9,716,036 | B2 | 7/2017 | Chang |

(Continued)

OTHER PUBLICATIONS

Hoffmann et al., "Demonstration of High-speed Hysteresis-free Negative Capacitance in Ferroelectric Hf0.5 Zr0.5 O2", 2018 IEEE International Electron Devices Meeting (IEDM), pp. 31.6.1-31.6.4.

(Continued)

*Primary Examiner* — Nikolay K Yushin
(74) *Attorney, Agent, or Firm* — Teddi E Maranzano

(57) ABSTRACT

A first source drain region directly adjacent to a first nanosheet stack, a second source drain region directly adjacent to a second nanosheet stack, an inner electrode of a capacitor between the first source drain region and the second source drain region and a non-conducting layer sandwiched between the inner electrode and the first source drain region. A first source drain region directly adjacent to a first nanosheet stack, a second source drain region directly adjacent to a second nanosheet stack, an inner electrode of a capacitor between the first source drain region and the second source drain region, a first liner sandwiched between the inner electrode and the first source drain region, and a second liner sandwiched between the inner electrode and the second source drain region.

20 Claims, 20 Drawing Sheets

(51) Int. Cl.

| | |
|---|---|
| ***H01L 29/417*** | (2006.01) |
| ***H01L 29/423*** | (2006.01) |
| ***H01L 29/778*** | (2006.01) |
| ***H01L 29/786*** | (2006.01) |
| ***H10D 1/66*** | (2025.01) |
| ***H10D 30/43*** | (2025.01) |
| ***H10D 30/67*** | (2025.01) |
| ***H10D 62/10*** | (2025.01) |

(52) U.S. Cl.
CPC ..... *H10D 30/6735* (2025.01); *H10D 30/6757* (2025.01); *H10D 62/121* (2025.01)

(58) Field of Classification Search
CPC ... H10D 64/017; H10D 64/018; H10D 64/258
See application file for complete search history.

(56) References Cited

U.S. PATENT DOCUMENTS

| | | | |
|---|---|---|---|
| 9,741,657 | B2 | 8/2017 | Filippi |
| 9,892,970 | B2 | 2/2018 | Farooq |
| 10,734,473 | B2 | 8/2020 | Cheng |
| 11,450,659 | B2 | 9/2022 | Reznicek |
| 2022/0181252 | A1 | 6/2022 | Vega |
| 2023/0133157 | A1 | 5/2023 | Xie |

OTHER PUBLICATIONS

Hoffmann et al., “Unveiling the double-well energy landscape in a ferroelectric layer”, Letter, @ 2019 Springer Nature Limited, Nature | www.nature.com/nature, 12 pages.

Vega et al., Pending U.S. Appl. No. 18/069,213, filed Dec. 20, 2022, entitled: “Decoupling Capacitor Inside Backside Power Distribution Network Powervia Trench”, 31 pages.

TRENCH CAPACITOR IN BACKSIDE DIFFUSION BREAK

BACKGROUND

The present invention relates, generally, to the field of semiconductor manufacturing, and more particularly to a trench capacitor in a backside diffusion break.

Complementary metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

SUMMARY

According to an embodiment, a semiconductor device is provided. The semiconductor device including a first source drain region directly adjacent to a first nanosheet stack, a second source drain region directly adjacent to a second nanosheet stack and an inner electrode of a capacitor between the first source drain region and the second source drain region.

According to an embodiment, a semiconductor device is provided. The semiconductor device includes a first source drain region directly adjacent to a first nanosheet stack, a second source drain region directly adjacent to a second nanosheet stack, an inner electrode of a capacitor between the first source drain region and the second source drain region and a non-conducting layer sandwiched between the inner electrode and the first source drain region.

According to an embodiment, a semiconductor device is provided. The semiconductor device includes a first source drain region directly adjacent to a first nanosheet stack, a second source drain region directly adjacent to a second nanosheet stack, an inner electrode of a capacitor between the first source drain region and the second source drain region, a first liner sandwiched between the inner electrode and the first source drain region and a second liner sandwiched between the inner electrode and the second source drain region.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
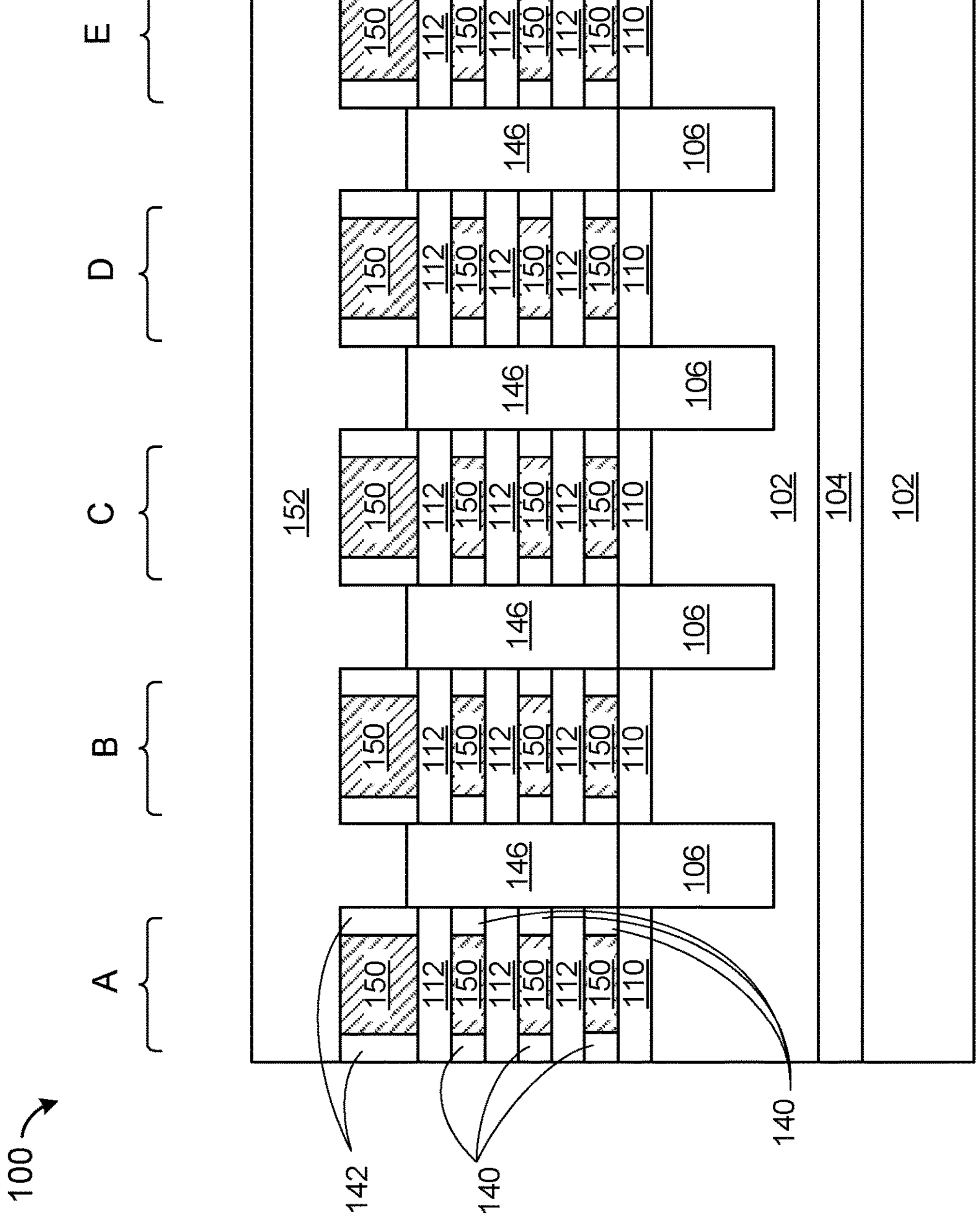
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates, generally, to the field of semiconductor manufacturing, and more particularly to a trench capacitor in a backside diffusion break.

Complementary metal-oxide-semiconductor (CMOS) technology is commonly used for FET as part of advanced integrated circuits (hereinafter "IC"), such as central processing units (hereinafter "CPUs"), memory, storage devices, and the like. Nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

Connectors may be formed to a source drain and to a replacement metal gate of the nanosheet FET. Back end of line (hereinafter "BEOL") layers may be formed on the structure and connect to the source drain connector and to the replacement metal gate connector. The BEOL layers may contain a power rail.

Power rail noise is detrimental to system performance. Increased noise increases a VDD guard band requirement, resulting in a reduced Vnom. VDD guard band requirement is a way of accounting for noise along the power grid, to avoid an occurrence of a voltage spike which extends beyond the maximum allowable voltage for the technology (Vmax). For instance, if Vmax=1V and the power grid has +/−0.2V of noise, then Vnom would be "guardbanded" to a maximum of 0.8V. If on the other hand the noise level is +/−0.05V, then Vnom can increase to 0.95V.

Using de-coupling capacitors (DCAP) helps to reduce power rail noise. Ideally high capacitance density capacitors are placed as close as possible to both power rail and the switching logic of the nanosheet FETs. (minimum resistance path)

Minimum resistance path means that placing the DCAP immediately adjacent to the power rail next to the switching transistors results in the minimum possible resistance between the DCAP and the portion of the power grid that is supplying current to the switching transistor. By reducing this resistance, the DCAP can suppress noise along a broader range of frequencies (in particular higher frequency noise).

In an embodiment of the present invention, nanosheet FETs are formed on a substrate. Front end contacts to the nanosheet FETs are formed and BEOL layers formed. A carrier wafer is connected on an upper surface above the BEOL layers. The substrate is flipped, and processing continues from a backside of the structure. A nanosheet FET is removed and a capacitor is formed in a trench where the nanosheet was removed. Backside contacts to the rest of nanosheet FETs are formed. A backside contact to the capacitor is formed.

The present invention relates, generally, to the field of semiconductor manufacturing, and more particularly to a trench capacitor in a backside diffusion break.

Embodiments of the present invention disclose a structure and a method of forming a trench capacitor in a single diffusion break region, are described in detail below by referring to the accompanying drawings in FIGS. 1-20, in accordance with an illustrative embodiment.

Referring now to FIG. 1, a cross-sectional view of a semiconductor structure 100 (hereinafter "structure") at an intermediate stage of fabrication is shown according to an exemplary embodiment. The structure 100 may be formed or provided.

Several steps have been completed to form the structure 100. The structure 100 includes a substrate 102, an etch stop layer 104, a sacrificial placeholder 106, a bottom dielectric isolation (hereinafter "BDI") 110, nanosheet layers, inner spacers 140, gate side spacers 142, a source drain 146, a replacement gate 150 and an interlayer dielectric (hereinafter "ILD") 152.

In an embodiment, although the illustrations describe the presence of a BDI layer, this layer is not strictly necessary for this invention. The nanosheet device may also be a "bulk" nanosheet wherein the structure is almost exactly the same except for the lack of a BDI region.

The substrate 102 may be a silicon-on-insulator ("SOI) substrate. In other embodiments, the substrate may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

The etch stop layer 104 may be silicon germanium. The purpose of this layer is to assure etch uniformity of the backside substrate etch. Having this layer would allow for a selective wet etch of most of the Si substrate, down to the etch stop layer 104. Then this layer can be selectively etched to reveal the final, thinned substrate thickness. Alternately, if full substrate removal is required, then the remainder of substrate 102 can be etched away after the etch stop layer 104 is selectively removed.

The nanosheet layers may have included a bottom sacrificial layer (not shown), and alternating layers of sacrificial semiconductor material and semiconductor channel material, which may include a sacrificial semiconductor material layer (hereinafter "sacrificial layer"), not shown, covered by a semiconductor channel material layer 112 (hereinafter "channel layer"), covered by a sacrificial layer (not shown), covered by a channel layer 112, covered by a sacrificial layer (not shown), covered by a channel layer 112.

The bottom sacrificial layer (not shown) can be formed by epitaxial growth of a sacrificial material on the substrate 102. The alternating layers of sacrificial layer (not shown) and channel layer 112 can be formed by sequential epitaxial growth of alternating layers of a first semiconductor material, and a second semiconductor material stacked one on top of another on the bottom sacrificial layer (not shown). It should be noted that, while a limited number of alternating layers are depicted, any number of alternating layers may be formed. The epitaxial growth of the first and second semiconductor materials that provide the sacrificial semiconductor material layers and the semiconductor channel material layers, respectively, can be performed utilizing any well-known precursor gas or gas mixture. Carrier gases like silane, germane, and disilane can be used.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RTCVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking.

Each sacrificial layer (not shown) is composed of a first semiconductor material which differs in composition from at least the bottom sacrificial layer (not shown) and the channel layer 112. In an embodiment, each sacrificial layer (not shown) may be a silicon-germanium semiconductor alloy and have a germanium concentration less than 50 atomic percent. In another example, each sacrificial layer (not shown) may have a germanium concentration ranging from about 20 atomic percent to about 40 atomic percent. Each sacrificial layer (not shown) can be formed using known deposition techniques or an epitaxial growth technique as described above.

Each channel layer 112 is composed of a second semiconductor material which differs in composition from at least the bottom sacrificial layer (not shown) and the sacrificial layer (not shown). Each channel layer 112 has a different etch rate than the first semiconductor material of sacrificial layer (not shown). The second semiconductor material can be, for example, silicon. The second semiconductor material, for each channel layer 112 can be formed using known deposition techniques or an epitaxial growth technique as described above.

The sacrificial layers (not shown) may have a thickness ranging from about 5 nm to about 15 nm, and the channel layers 112 may have a thickness ranging from about 4 nm to about 12 nm. Each sacrificial layer (not shown) may have a thickness that is the same as, or different from, a thickness of each channel layer 112. In an embodiment, each sacrificial layer (not shown) has an identical thickness. In an embodiment, each channel layer 112 has an identical thickness.

An active device region is defined by removing unwanted portions of the nanosheet layers or nanosheet stack. Remaining portions of the nanosheet stack are formed into fins of nanosheet stack by the removal of the portions of the nanosheet layers, exposing an upper portion of the substrate 102.

The fins of the nanosheet stack may be formed by methods known in the arts, and include steps such as forming a hard mask, on the alternating layers, patterning the hard mask, and subsequent formation of one or more trenches, by removal of portions of each layer of the stacked nanosheet. The trench may form the nanosheet stack into fins of the nanosheet stack by an anisotropic etching technique, such as, for example, reactive ion etching (RIE), and stopping on etching a portion of the substrate 102 between each nanosheet stack.

Each fin of nanosheet stack of nanosheet stack may include a bottom sacrificial layer (not shown), covered by a sacrificial layer (not shown), covered by a channel layer 112, covered by a sacrificial layer (not shown), covered by a channel layer 112, covered by a sacrificial layer (not shown), covered by a channel layer 112. By way of illustration, five fins of the nanosheet stack are depicted in the drawings of the present application, although any number of fins of nanosheet stack may be formed.

The sacrificial gate (not shown) is formed orthogonal (perpendicular) to the fins of nanosheet stack. The sacrificial gate (not shown) may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate (not shown) can include any material including, for example, polysilicon, amorphous silicon, or multilayered combinations thereof. In an embodiment where amorphous silicon is used as a material for the sacrificial gate (not shown), a thin layer of SiO2 is deposited first to separate the nanosheet stack from the amorphous silicon. The sacrificial gate (not shown) can be formed using any deposition technique including, for example, chemical vapor deposition (CVD), physical vapor deposition (PVD), high density plasma (HDP) deposition, and spin on techniques.

In an embodiment, the sacrificial gate (not shown) is deposited with a thickness sufficient to fill, or substantially fill, the spaces between adjacent nanosheet structures and cover a horizontal upper surface of the uppermost channel layer 112 of the nanosheet stack. The sacrificial gate (not shown) may be adjacent to vertical side surfaces of the nanosheet stack or fins of nanosheet stack. The sacrificial gate (not shown) may cover an upper horizontal surface of the substrate 102 between adjacent nanosheet stacks. A height of the sacrificial gate (not shown) may be much thicker than the underlying structure and may have a height between 100 nm and 150 nm about the nanosheet stack. Gate patterning may be performed by conventional lithography and etch process, such that portions of the sacrificial gate (not shown) are removed from a subsequently formed source drain region.

Portions of the nanosheet fins are removed selective to the sacrificial gate (not shown), forming a recess (not shown). Remaining portions of the nanosheet fins may be referred to as a stacked nanosheet or a nanosheet stack. The nanosheet stack is used to produce a gate all around device that includes vertically stacked semiconductor channel material nanosheets for a p-FET or an n-FET.

FIG. 1 illustrates a view between adjacent sacrificial gates (not shown), parallel to the sacrificial gates (not shown) and perpendicular to the fins of the nanosheet stack.

The gate side spacers 142 may be formed vertically aligned with the sacrificial gate (not shown). The gate side spacers 142 may have a vertical side surface aligned with vertical side surfaces of the channel layers 112. The gate side spacers 142 may have a vertical side surface adjacent to a vertical side surface of the sacrificial gate (not shown).

The gate side spacers 142 may be formed after several processes, including for example, conformally depositing or growing a dielectric and performing an anisotropic etch back process. The gate side spacers 142 may include any dielectric material such as silicon nitride (SiN), silicon boron carbon nitride (SiBCN), silicon oxide carbon nitride (SiOCN), SiOC, SiC or aluminum oxide (AlOx), and may include a single layer or may include multiple layers of dielectric material. The gate side spacers 142 may have a thickness ranging from about 3 nm to about 15 nm.

Outer portions of the sacrificial layers (not shown) may be selectively removed using known techniques. For example, a wet or dry etch process can be used with the appropriate chemistry to remove portions of each of the sacrificial layers (not shown). The material used for the etching process may be selective such that the channel layers 112, the sacrificial gate (not shown), the bottom sacrificial layer (not shown) and the substrate 102 remain and are not etched. After etching, portions of the sacrificial layers (not shown) covered on opposite sides by the sacrificial gate (not shown) may remain as part of the nanosheet stack.

The inner spacer 140 may be formed by conformally depositing or growing a dielectric material, followed by a combination of dry and wet isotropic etch and recessing steps. The inner spacer 140 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch process such as a wet etch process, or any suitable etch process. In an embodiment, the inner spacer 140 may include one or more layers. In an embodiment, the inner spacer 140 may include any dielectric material such as silicon oxynitride, silicon nitride, SiBCN, SiOC, or any combination of these materials. The inner spacer 140 may completely fill in spaces between the channel layers 112, where the portions of the sacrificial layers (not shown) had been previously removed. A vertical side surface of the inner spacer 140 may be aligned with a vertical side surface of the channel layers 112 and a vertical side surface of the gate side spacers 142 surrounding the sacrificial gate (not shown).

The bottom sacrificial layer (not shown) may be selectively removed using known techniques. For example, a wet or dry etch process can be used with the appropriate chemistry to remove portions of the bottom sacrificial layer (not shown). The material used for the etching process may be selective such that the channel layers 112, the sacrificial gate (not shown), the gate side spacers 142, the inner spacers 140 and the substrate 102 remain and are not etched. After etching, portions of the sacrificial layers (not shown) covered on opposite sides by the sacrificial gate (not shown) may remain as part of the nanosheet stack.

The BDI 110 may be formed by conformally depositing or growing a dielectric material, followed by a combination of dry and wet isotropic etch and recessing steps. The BDI 110 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch process such as a wet etch process, or any suitable etch process. In an embodiment, the BDI 110 may include one or more layers. In an embodiment, the BDI 110 may include any dielectric material such as silicon oxynitride, silicon nitride, SiBCN, SiOC, or any combination of these materials. The BDI 110 may completely fill in spaces between a bottom most channel layer 112 and the substrate 102, where the bottom sacrificial layer (not shown) had been previously removed. A vertical side surface of the BDI 110 may be aligned with a vertical side surface of the channel layers 112 and a vertical side surface of the gate side spacers 142 surrounding the sacrificial gate (not shown).

In an embodiment, the gate side spacers 142, the inner spacer 140 and the BDI 110 may be formed simultaneously. The gate side spacers 142, the inner spacer 140 and the BDI 110 may have vertically aligned side surfaces.

FIG. 1 illustrates five nanosheet stacks, which are identified as nanosheet stack A, nanosheet stack B, nanosheet stack C, nanosheet stack D and nanosheet stack E.

A trench (not shown) is formed in the substrate 102, between adjacent nanosheet stacks, specifically between nanosheet stacks A, B, between nanosheet stacks B, C, between nanosheet stacks C, D and between nanosheet stacks D, E. The trench (not shown) is vertically aligned with the adjacent nanosheet stacks and is formed by removal of a portion of the substrate 102. The sacrificial placeholder 106 is formed in the trench (not shown). A lower horizontal surface and a portion of vertical side surfaces of the sacrificial placeholder 106 is directly adjacent to the substrate 102. A remaining portion of the vertical side surfaces of the sacrificial placeholder 106 is directly adjacent to the BDI 110.

The sacrificial placeholder 106 may be epitaxially grown. The sacrificial placeholder 106, may, for example, be silicon germanium with a germanium concentration approximately ranging from about 35 atomic percent to 85 atomic percent, although percentages greater than 85 percent and less than 35 percent may be used, which may be referred to as silicon germanium (SiGe) with a high germanium concentration. The sacrificial placeholder 106 may have a thickness, ranging from 3 nm-10 nm.

The purpose of the sacrificial placeholder 106 is to primarily serves the function of acting as a template to enable a self-aligned direct backside contact (DBC) formation to the backside of the source/drain regions.

The source drain 146 may be epitaxially grown surrounding a vertical portion of the nanosheet stack on opposite sides of the sacrificial gate (not shown). A lower surface of the source drain 146 may be adjacent to an upper surface of the sacrificial placeholder 106. A vertical side surface of the source drain 146 may be adjacent to vertical side surfaces of the inner spacer 140 and vertical side surfaces of the channel layers 112. An upper surface of the source drain 146 may be a greater distance from the substrate 102 than an upper surface of an uppermost channel layer 112.

The sacrificial gate (not shown) and the sacrificial layers (not shown) are removed. The replacement gate 150 is formed where the sacrificial gate (not shown) and the sacrificial layers (not shown) were removed. The sacrificial gate (not shown) may be removed by methods known in the arts. The sacrificial layers (not shown) are removed selective to the channel layers 112, the inner spacers 140, the source drain 146, the gate side spacer 142, the BDI 110, the sacrificial placeholder 106 and the substrate 102. For example, a dry etch process can be used to selectively remove the sacrificial layers 110, such as using vapor phased HCl dry etch. An upper surface and a lower surface of the channel layers 112 may be exposed. An upper surface of the BDI 110 may be exposed.

The replacement gate 150 may be conformally formed on the structure 100, according to an exemplary embodiment. The replacement gate 150 is formed in each cavity of the nanosheet stack and surrounding suspended portions of the channel layers 112. The replacement gate 150 forms a layer surrounding exposed portions of the nanosheet stacks. The replacement gate 150 may cover an exposed upper horizontal surface of the substrate 102, exposed vertical side surfaces of one side of each of the gate side spacers 142 and exposed vertical surfaces of one side of the inner spacers 140. The replacement gate 150 may cover vertical side surfaces, an upper horizontal surface and a lower horizontal surface of the channel layers 110. The replacement gate 150 may fill a space between the gate side spacers 142, where the sacrificial gate (not shown) was removed.

The replacement gate 150 may be deposited using typical deposition techniques, for example, atomic layer deposition (ALD), molecular layer deposition (MLD), and chemical vapor deposition (CVD). In an embodiment, the replacement gate 150 may include more than one layer, for example, a conformal layer of a high-k dielectric material such as $HfO_2$, $ZrO_2$, $La_2O_3$, $Al_2O_3$, $TiO_2$, $SrTiO_3$, $LaALO_3$, $Y_2O_3$, $HfO_xN_y$, $ZrO_xN_y$, $La_2OdN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. In an embodiment, a work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

The ILD 152 may be formed by conformally depositing or growing a dielectric material, followed by a CMP or etch steps. The ILD 152 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 152 may include one or more layers. In an embodiment, the ILD 152 may include any dielectric material such as silicon oxide, silicon oxynitride, silicon nitride, SiBCN, SiOC, low-k dielectric or any combination of these materials. The ILD 152 covers an upper horizontal surface and vertical side surfaces of the source drain 146, the replacement gate 150 and the gate side spacers 142.

A chemical mechanical polishing (CMP) technique may be used to remove excess material and polish upper surfaces of the structure 100, removing excess material of the ILD 152.

Figure 2:
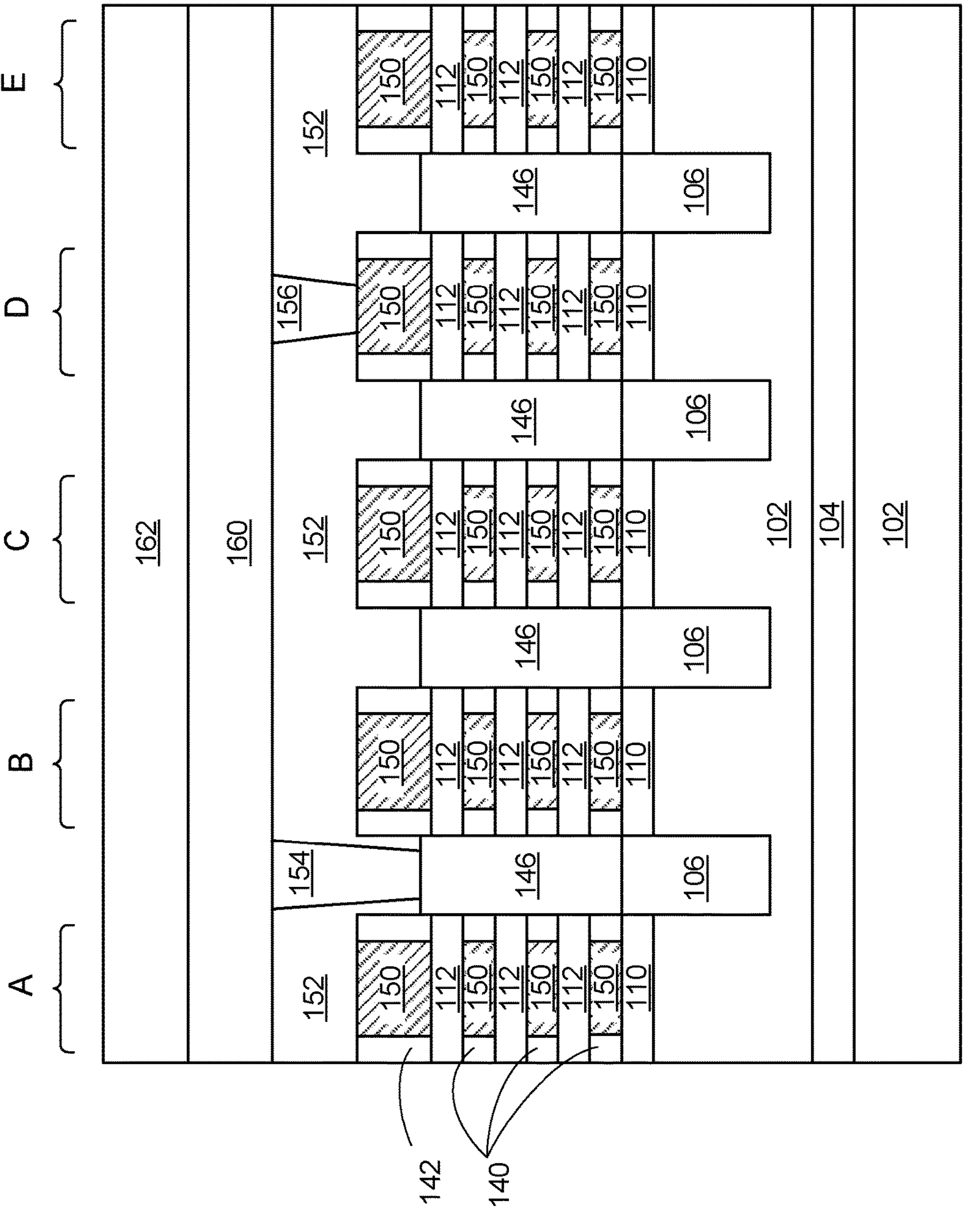
FIG. 2 illustrates a cross-sectional view of the semiconductor structure, and illustrates formation of back end of line layers and mounting of a carrier wafer, according to an exemplary embodiment.

Referring now to FIG. 2, the structure 100 is shown according to an exemplary embodiment. A contact 154 and a contact 156 may be formed. Back end of line (hereinafter "BEOL") layers 160 may be formed on the structure 100, on the ILD 152, connecting to the contacts 154, 156. A carrier wafer 162 may be mounted on the structure 100.

The contacts 154, 156 may be formed by methods known in the arts. The contacts 154, 156 may have more than one layer. The contacts 154, 156 may include a silicide liner such as Ti, Ni, NiPt, an adhesion liner, such as TiN and a conductive metal, such as W, Co, Ru, or Mo. A chemical mechanical polishing (CMP) technique may be used to remove excess material and polish upper surfaces of the structure 100, exposing an upper horizontal surface of the ILD 152 and upper horizontal surfaces of the contacts 154, 156. The contact 154 forms a contact to the source drain 146 between the nanosheet stacks A, B. The contact 156 forms a contact to the replacement gate 150 of the nanosheet stack D.

The BEOL layers 160 may be formed on the ILD 152 and on the contacts 154, 156. The BEOL layers 160 may also be referred to as frontside interconnect layers. BEOL layers 160 includes layers of wiring and vias formed above the existing structure, above the contacts 154, 156 and the ILD 152. In an embodiment, the BEOL layers 160 may include 12 or more layers of metal lines and visas. The BEOL layers 160 may be formed using known techniques.

The carrier wafer 162 may be attached to an upper surface of the structure 100, mounted on an upper surface of the BEOL layers 160. The carrier wafer 162 may be attached using conventional wafer bonding process, such as dielectric-to-dielectric bonding or copper-to-copper bonding process.

Figure 3:
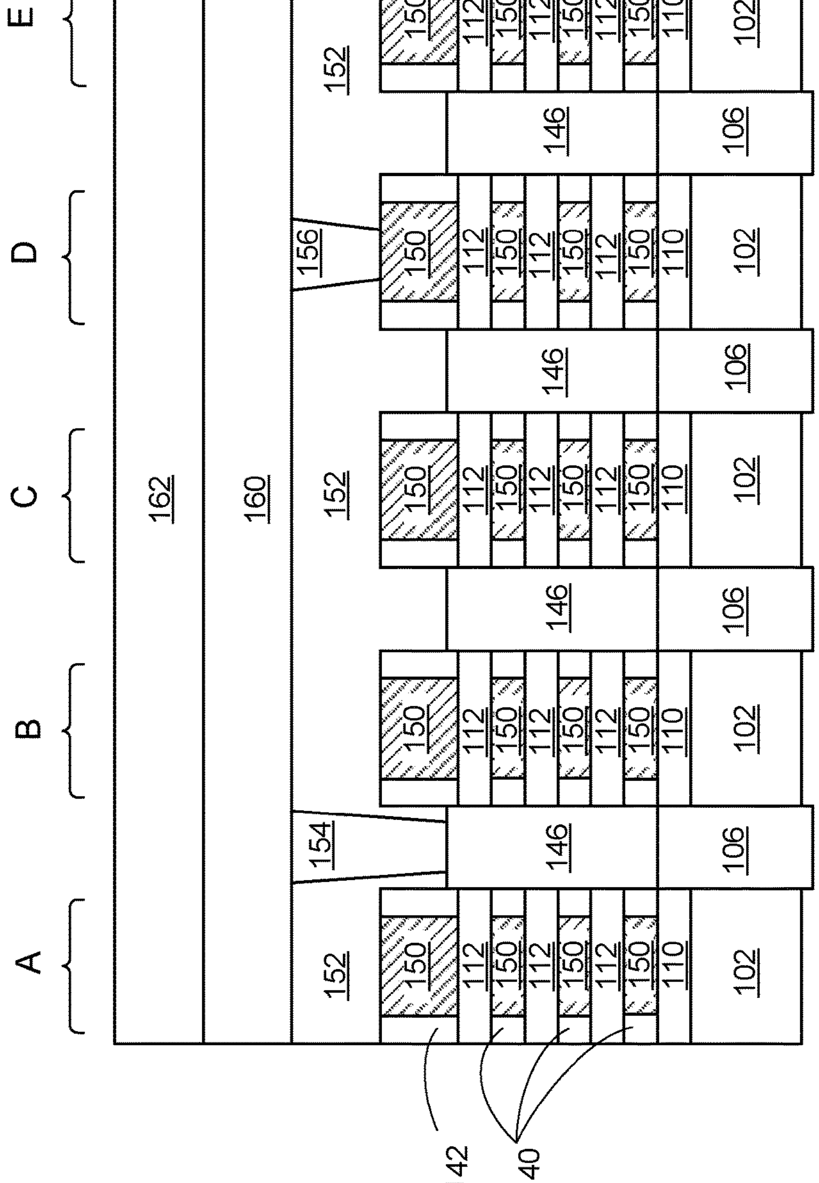
FIG. 3 illustrates a cross-sectional view of the semiconductor structure, and illustrates removal of a lower portion of a substrate and removal of an etch stop layer, according to an embodiment.

Referring now to FIG. 3, the structure 100 is shown according to an exemplary embodiment. The structure 100 may be flipped. A lower portion of the substrate 102 is removed. The etch stop layer 104 may be removed. Portions of an upper portion of the substrate 102 is removed.

The structure 100 may be turned such that the carrier wafer 162 is now at a bottom of the structure 100, and a lowermost surface of the substrate 102 is exposed above.

Processing will be done at a lower portion of the structure 100, which is physically now flipped. The illustrations will continue without showing the structure 100 flipped and will show processing of the bottom of the structure 100.

The lower portion of the substrate 102 below the etch stop layer 104, and the etch stop layer 104 are removed using a combination of processes steps, such as wafer grinding, CMP, RIE and wet etch process. Portions of the upper portion of the substrate 102 (which were above the etch stop layer 104) are removed, exposing a lower horizontal surface of the sacrificial placeholder 106.

Figure 4:
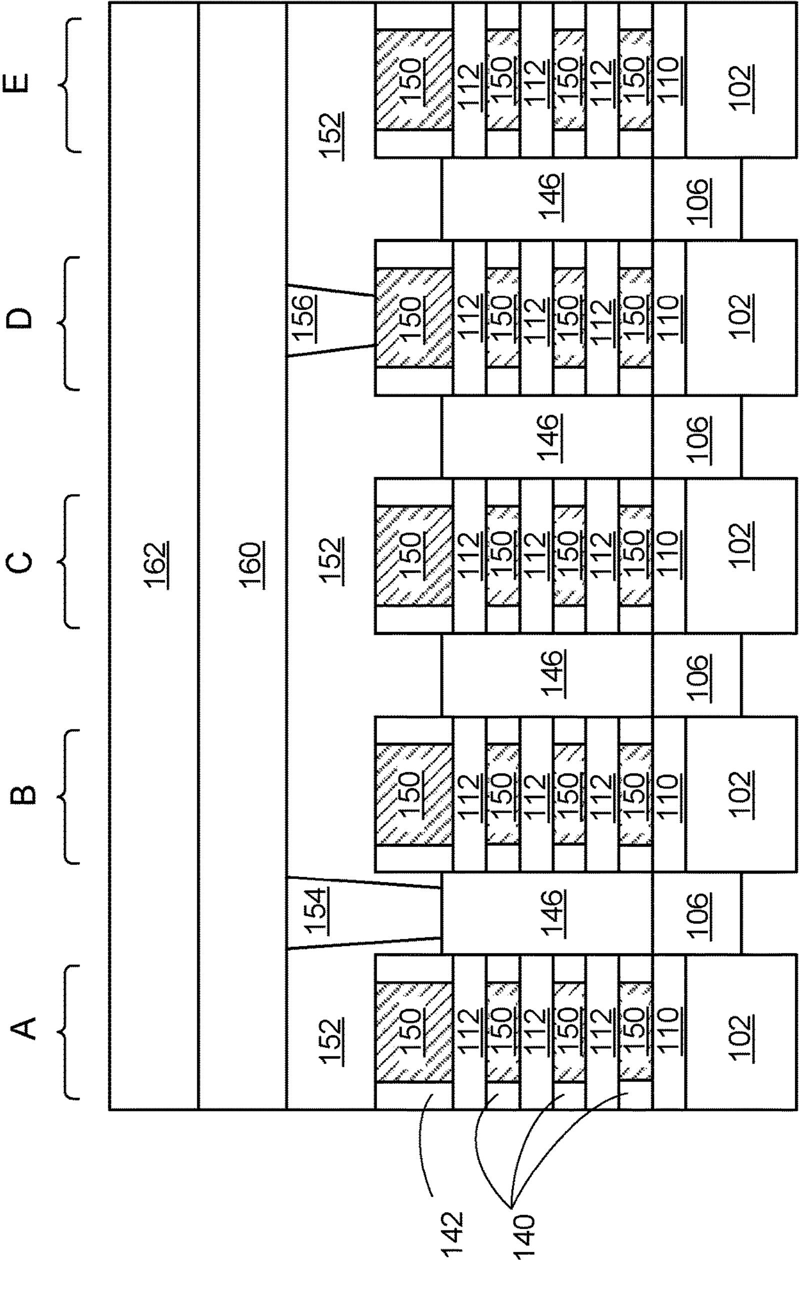
FIG. 4 illustrates a cross-sectional view of the semiconductor structure, and illustrates removal of portions of a sacrificial placeholder, according to an embodiment.

Referring now to FIG. 4, the structure 100 is shown according to an exemplary embodiment. Portions of the sacrificial placeholder 106 are removed.

The sacrificial placeholder 106 has portions removed by selective removal, selective to the substrate 102, using methods known in the arts.

Figure 5:
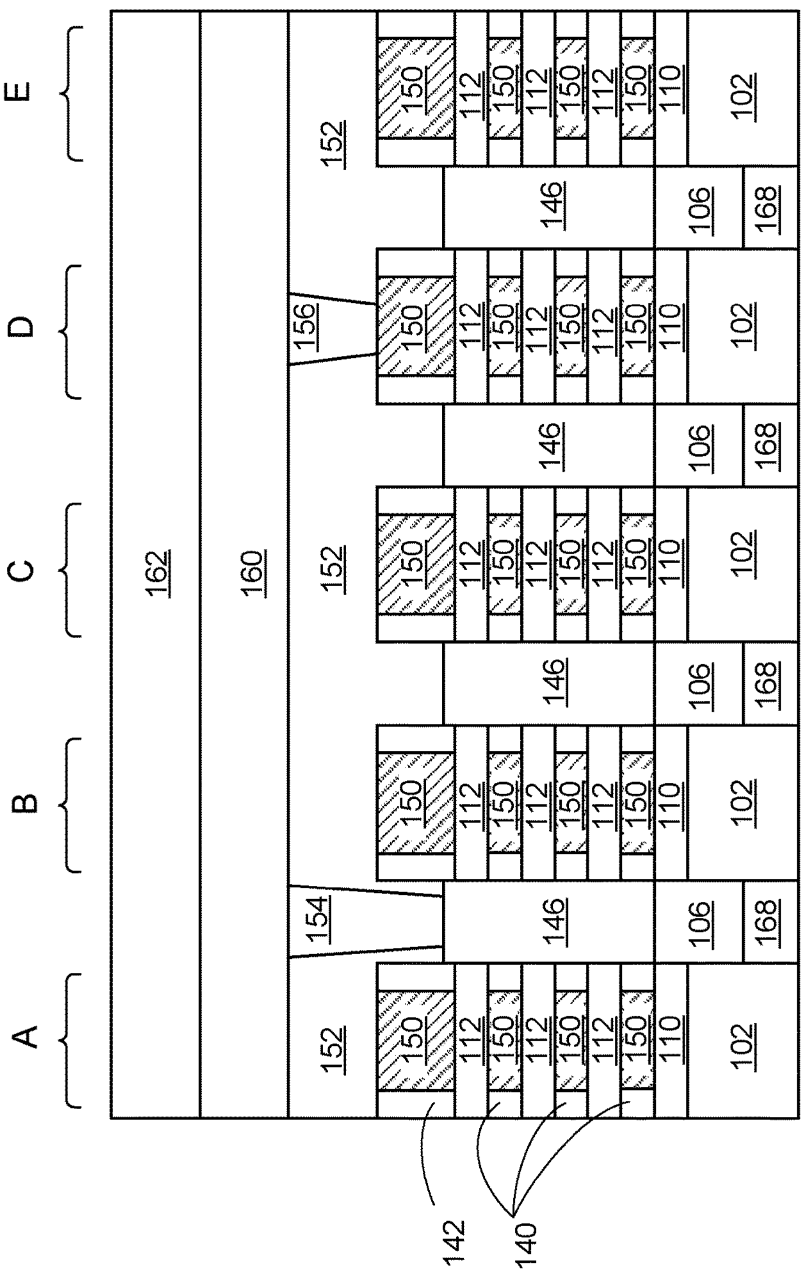
FIG. 5 illustrates a cross-sectional view of the semiconductor structure, and illustrates formation of a protective cap, according to an exemplary embodiment.
Figure 5:

Referring now to FIG. 5, the structure 100 is shown according to an exemplary embodiment. A protective cap 168 is formed where the portions of the sacrificial placeholder 106 were removed.

The protective cap 168 may be formed by conformally depositing or growing a dielectric material, followed by a CMP or etch steps. The protective cap 168 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the protective cap 168 may include one or more layers. In an embodiment, the protective cap 168 may include any dielectric material such as aluminum oxide (AlOx), SiC, SiOC and may include a single layer or may include multiple layers of dielectric material. An upper horizontal surface of the protective cap 168 is the sacrificial placeholder 106. Vertical side surfaces of the protective cap 168 is the substrate 102. A chemical mechanical polishing (CMP) technique may be used to remove excess material and polish lower surfaces of the structure 100, such that the lower horizontal surface of the protective cap 168 and the substrate 102 are coplanar.

The purpose of the protective cap 168 is to protect the placeholder 106 from subsequent etching of the nanosheet regions to form the backside diffusion break.

Figure 6:
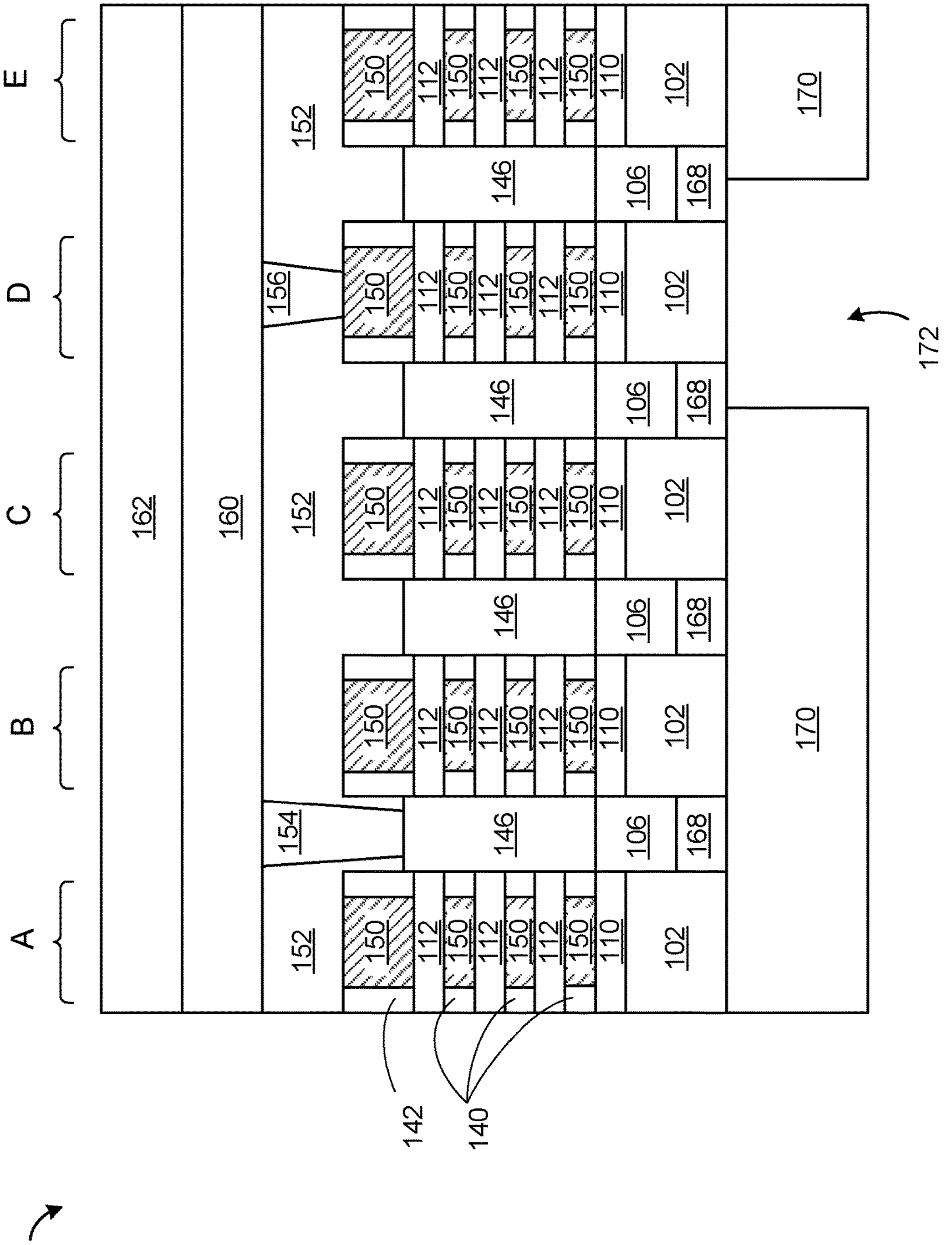
FIG. 6 illustrates a cross-sectional view of the semiconductor structure, and illustrates formation of a lithography soft mask, according to an embodiment.

Referring now to FIG. 6, the structure 100 is shown according to an exemplary embodiment. A lithography soft mask, such as an organic planarization layer 170 (hereinafter “OPL”) may be used for the patterning process.

The OPL 170 may be formed by a blanket deposition using typical deposition techniques, for example spin-on coating. The OPL 170 can be a self-planarizing organic material that includes carbon, hydrogen, oxygen, and optionally nitrogen, fluorine, and silicon. The OPL 170 can be a standard $C_xH_y$ polymer.

A lithograph patterning and dry etch technique may be used to selectively remove a portion of the OPL 170, which is subsequently used to create a diffusion break region, thereby forming an opening 172. The opening 172 exposes lower horizontal surfaces of the substrate 102 below the nanosheet D and portions of lower horizontal surfaces of the protection cap 168 surrounding the substrate 102 below the nanosheet D.

Figure 7:
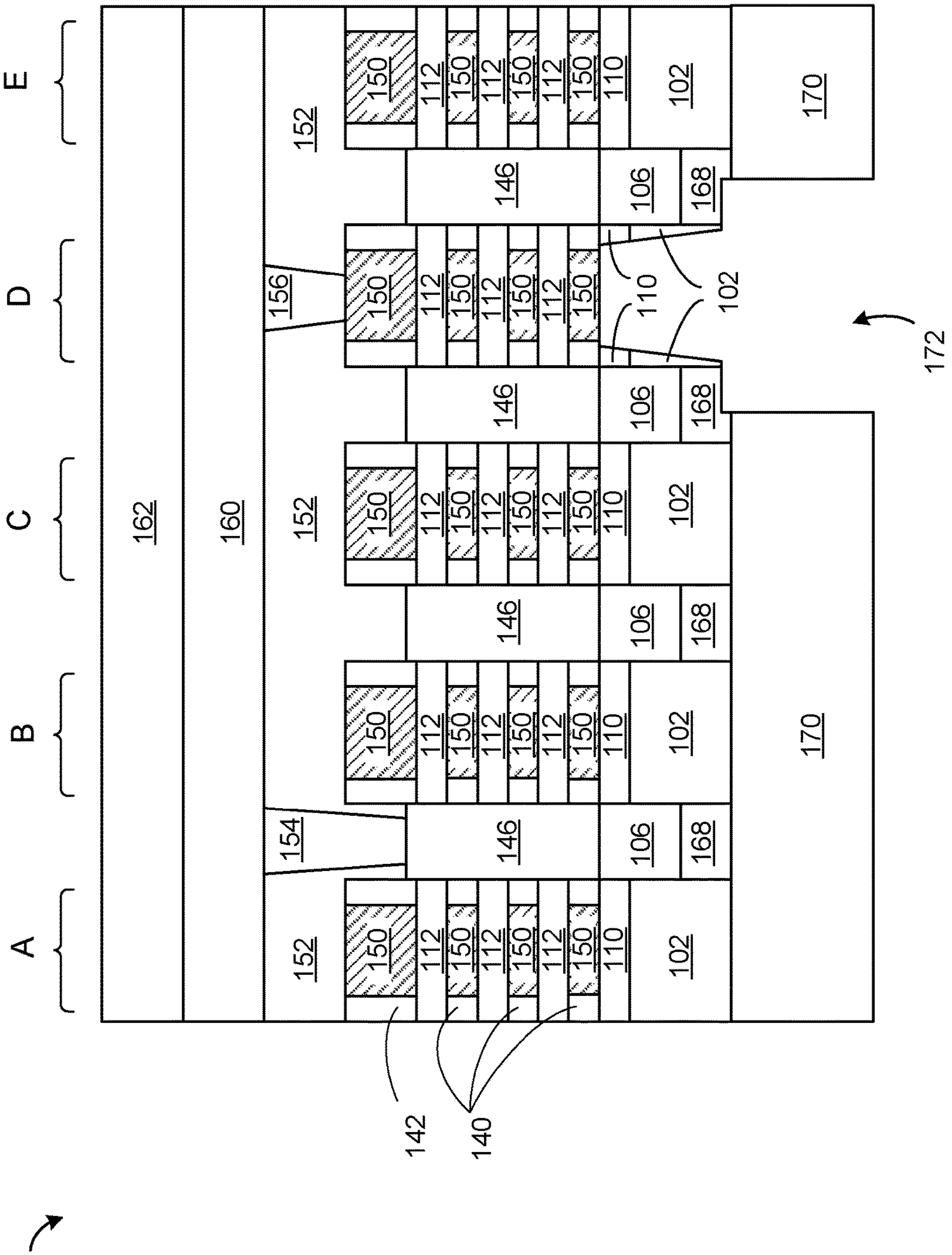
FIG. 7 illustrates a cross-sectional view of the semiconductor structure, and illustrates removal of additional portions of the substrate and removal of portions of a bottom dielectric isolation, according to an embodiment.

This opening 172 subsequently to be formed, as is illustrated in FIG. 7, will be self-aligned which means the boundaries of the opening are largely independent of the boundaries of the patterned region used to define the opening. Since the etch to form opening 172 is mostly selective against the cap 168, then if the patterned opening overlaps any part of the cap 168 on either side of the opening, the presence of the cap will “guide” the etch to only take place in between cap regions, resulting in the same opening 172 dimensions regardless of the alignment of the patterned opening relative to the caps 168.

Referring now to FIG. 7, the structure 100 is shown according to an exemplary embodiment. Portions of the substrate 102 below the nanosheet D are removed. Portions of the BDI 110 below the nanosheet D are removed.

The depth of the opening 172 is increased by removal of the portions of the substrate 102 below the nanosheet D and the removal of the portions of the BDI 110 below the nanosheet D by a selective etch process, selective to the cap 168 and the OPL 170. A lower horizontal surface of a lowermost portion of the replacement gate 150 in the nanosheet D is exposed.

Figure 8:
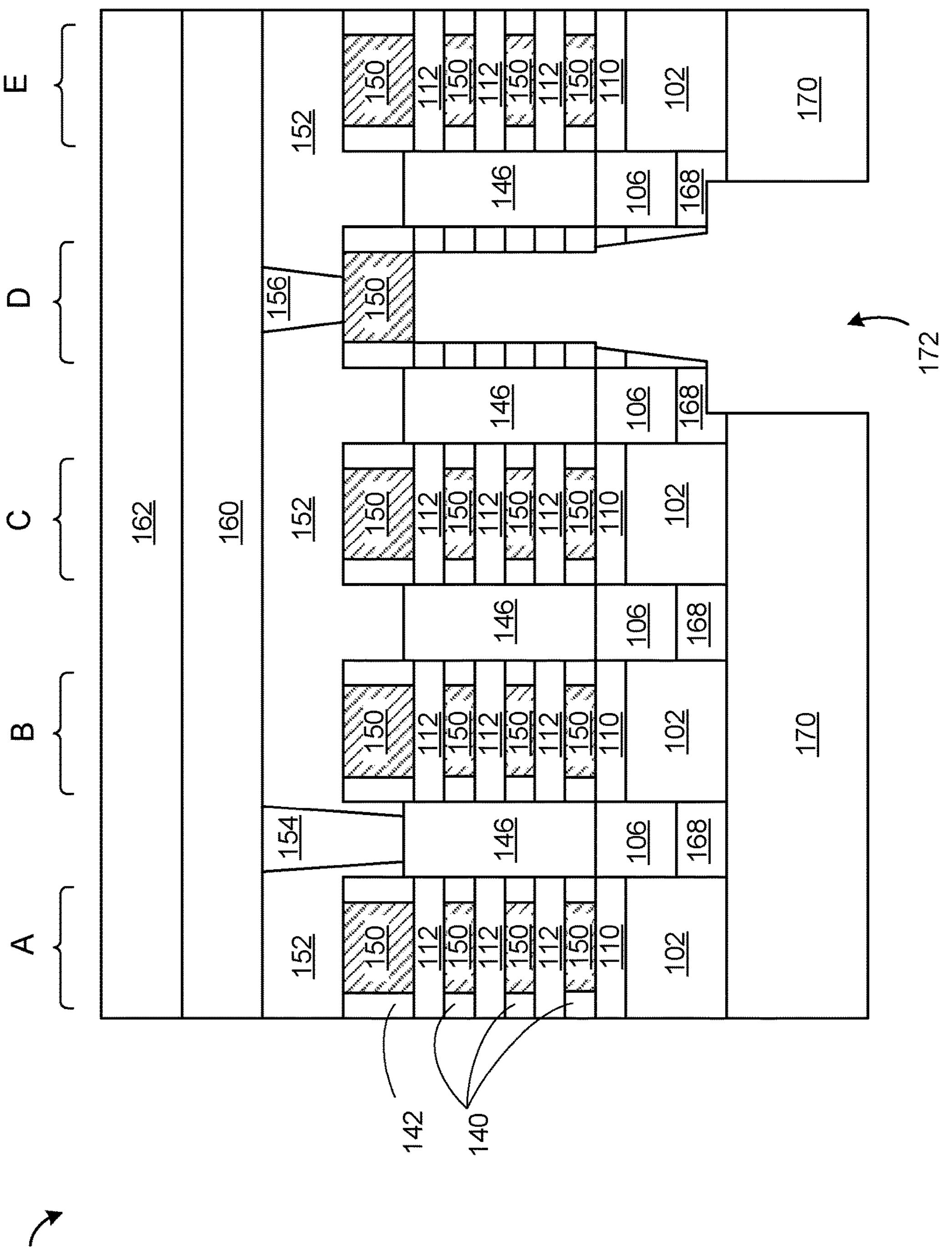
FIG. 8 illustrates a cross-sectional view of the semiconductor structure, and illustrates removal of portions of a replacement metal gate, according to an embodiment.

Referring now to FIG. 8, the structure 100 is shown according to an exemplary embodiment. Portions of the replacement metal gate 150 and portions of the channel layers 112 are removed in the nanosheet D.

The depth of the opening 172 may be further increased by an anisotropic etching technique such as, for example, a reactive ion etching (RIE) process that removes aligned portions of the replacement metal gate 150 and portions of the channel layers 112 in the nanosheet D. The etch stops at the replacement metal gate 150 above the uppermost channel layer 112 in the nanosheet D. Although used as a protective mask, a portion of the protective cap 168 below the nanosheet D may, more or less, be removed.

Figure 9:
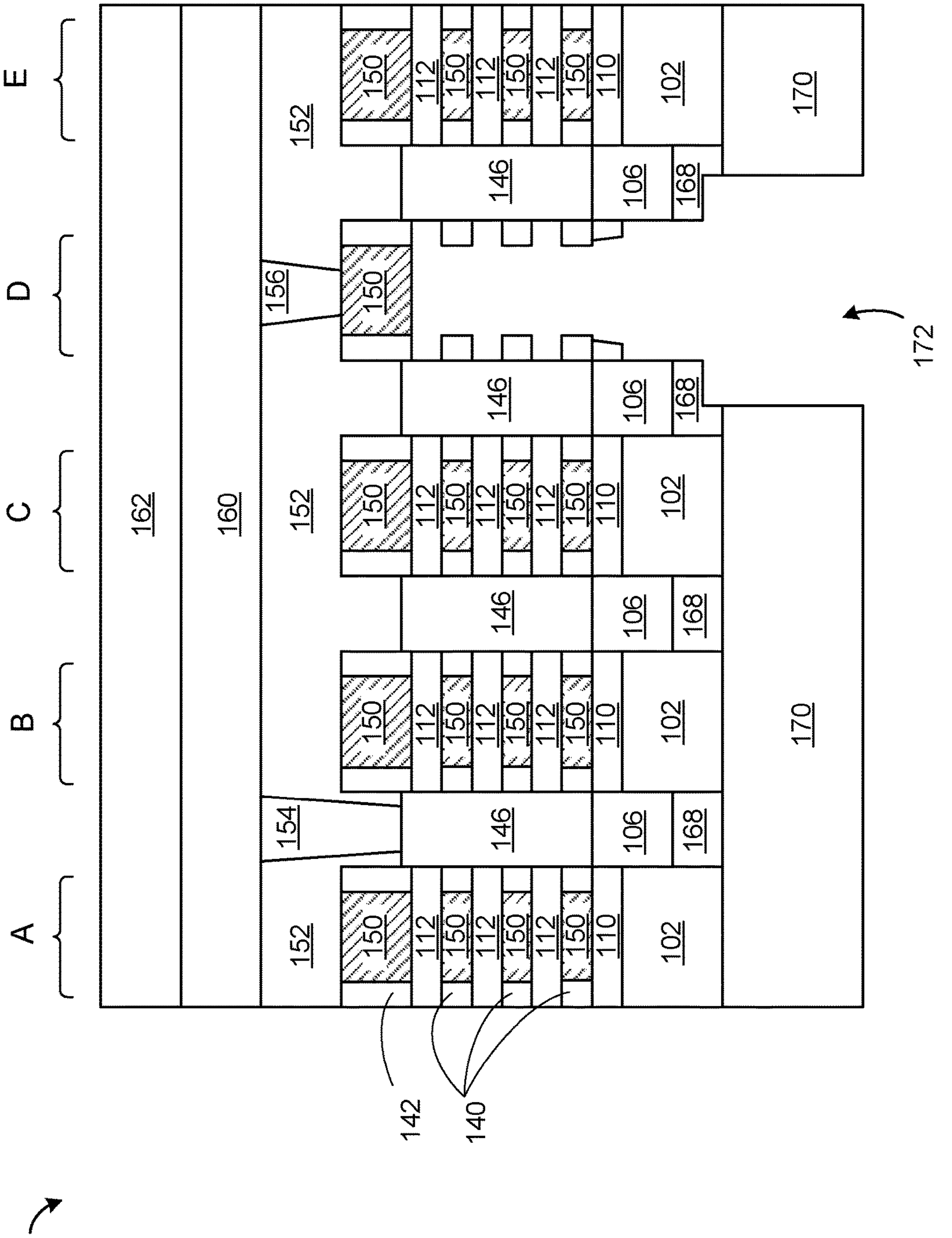
FIG. 9 illustrates a cross-sectional view of the semiconductor structure, and illustrates removal of portions of channel layers, according to an embodiment.

Referring now to FIG. 9, the structure 100 is shown according to an exemplary embodiment. Remaining portions of the channel layers 112 may be removed in the nanosheet D. A remaining portion of the substrate 102 may be removed in the nanosheet D.

The remaining portion of the channel layers 112 and the remaining portion of the substrate 102 may be removed in the nanosheet D by a selective isotropic etch, selective to the OPL 170, the protective cap 168, the sacrificial placeholder 106, the side spacers 140, the source drain 146, the gate side spacers 142 and the replacement metal gate 150. In other words, the selective isotropic etch may selectively remove the remaining portion of the channel layers 112 and the remaining portion of the substrate 102.

In an alternate embodiment, the remaining portion of the channel layers 112 and the remaining portion of the substrate 102 may not be removed at this stage and may be removed in one of the subsequently steps.

Figure 10:
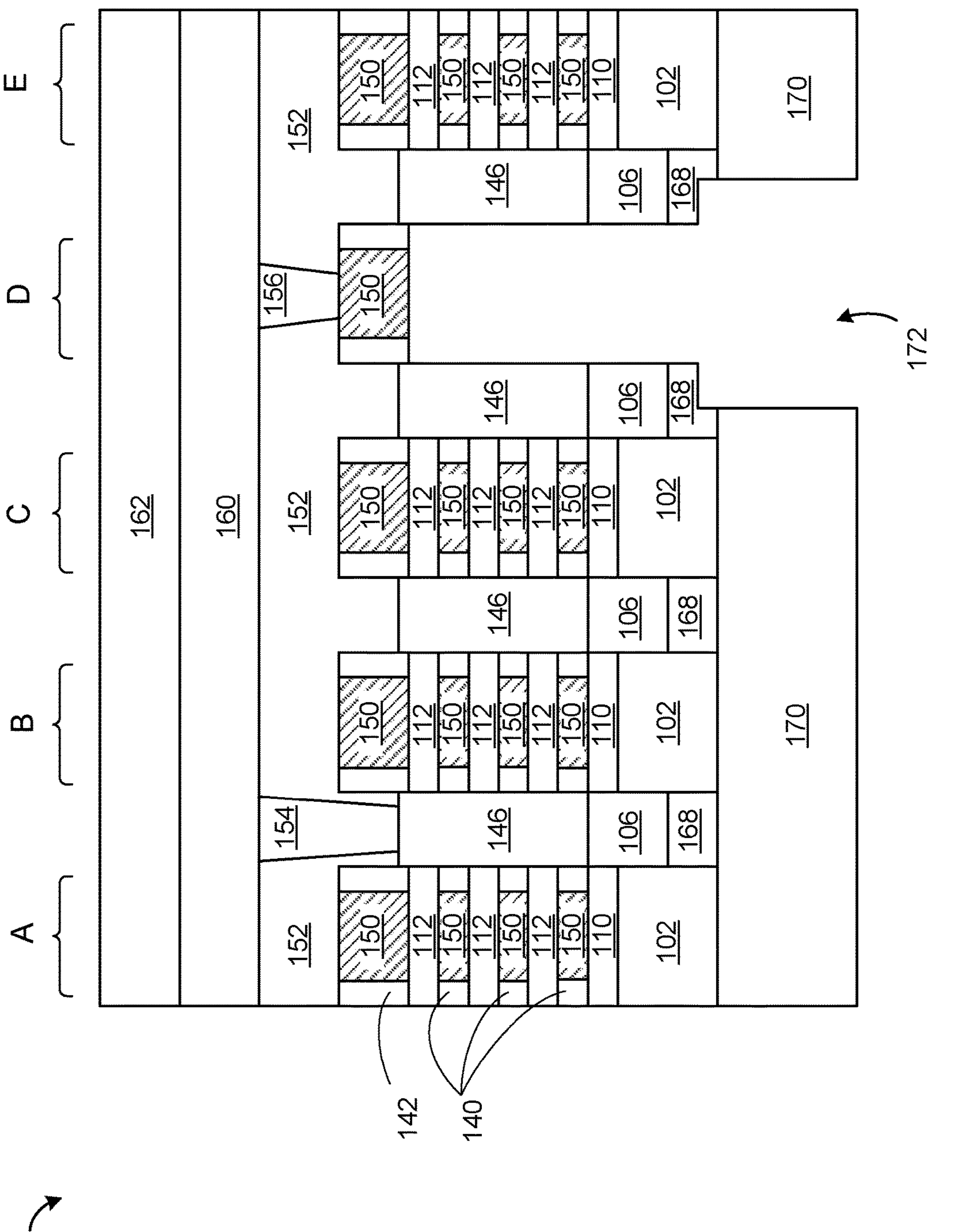
FIG. 10 illustrates a cross-sectional view of the semiconductor structure, and illustrates optional removal of side spacers and the bottom dielectric isolation in a nanosheet stack, according to an exemplary embodiment.

Referring now to FIG. 10, the structure 100 is shown according to an exemplary embodiment. The side spacers 140 and the BDI 110 may be removed in the nanosheet D. The remaining portion of the channel layers 112 and remaining portion of the substrate 102, if not already being removed at the above step, may be removed in the nanosheet D.

The side spacers 140 and the BDI 110 may be removed in the nanosheet D by a selective isotropic etch, selective to the OPL 170, the protective cap 168, the sacrificial placeholder 106, the source drain 146, the gate side spacers 142 and the replacement metal gate 150.

In an alternate embodiment, the side spacers 140 and the BDI 110 are not removed in the nanosheet D. In a further alternate embodiment, the remaining portion of the channel layers 112, the remaining portion of the substrate 102, the side spacers 140 and the BDI 110 are not removed in the nanosheet D.

Figure 11:
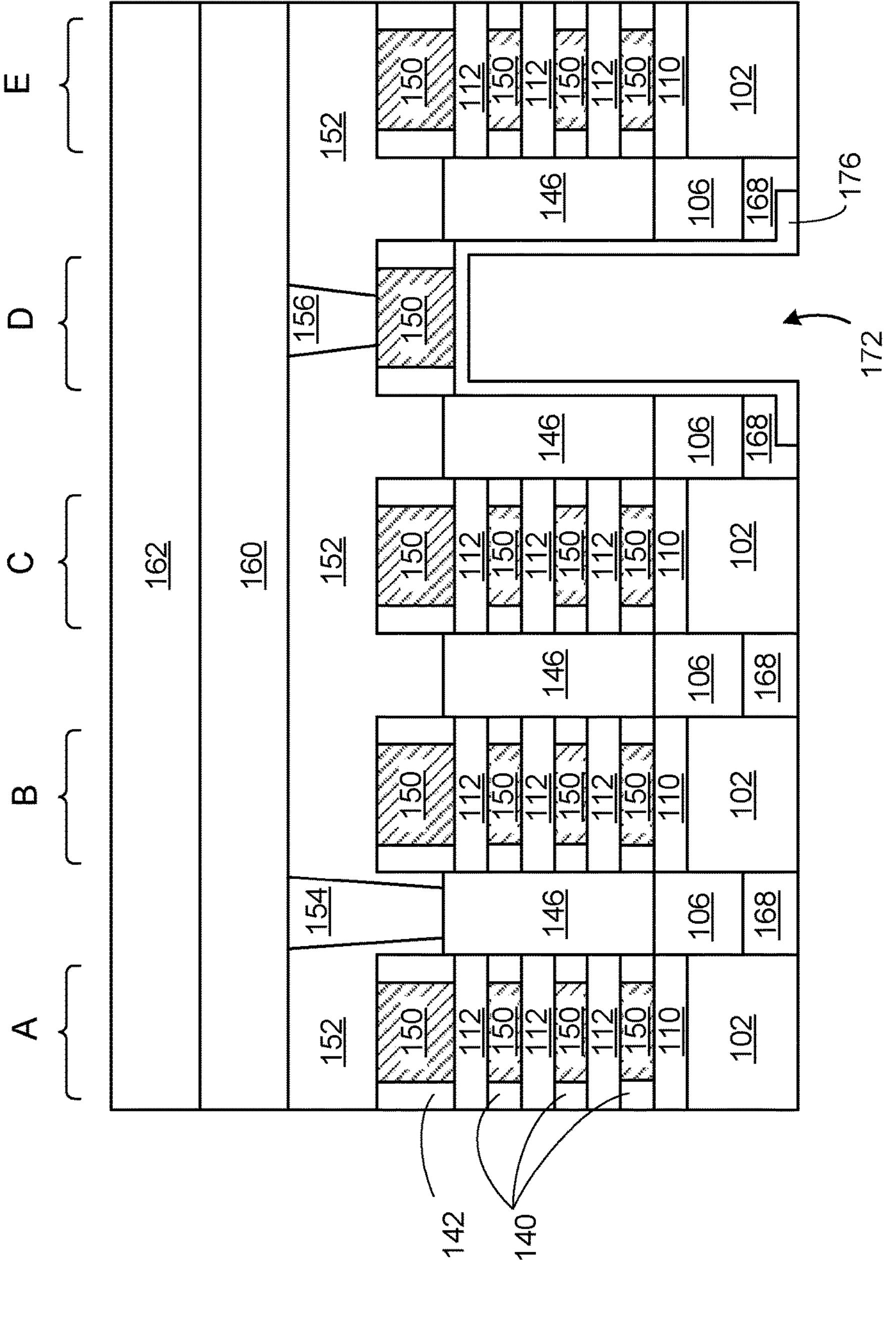
FIG. 11 illustrates a cross-sectional view of the semiconductor structure, and illustrates removal of the lithography soft mask and formation of a liner, according to an embodiment.

Referring now to FIG. 11, a cross-sectional view of the structure 100 is shown according to an exemplary embodiment. The OPL 170 may be removed. A non-conducting region 176 may be formed. In some embodiment, the non-conducting region 176 may be known as a liner as well.

The non-conducting region 176 may be conformally formed in the opening 172, partially filling the opening 172. The non-conducting region 176 may have a vertical side surface directly adjacent to the source drain 146, the sacrificial placeholder 106 and the protective cap 168 surrounding the nanosheet D. An upper horizontal surface of the non-conducting region 176 may be directly adjacent to the remaining replacement metal gate 150 and the gate side spacers 142 of the nanosheet D.

The non-conducting region 176 can be one or a combination of dielectric, ferroelectric, and antiferroelectric materials.

The non-conducting region 176 is a non-conductive material. The dielectric material used here would typically be some kind of oxide or nitride, of which there are many variants (SiO2, HfO2, Al2O3, SiN, AlN, etc.). The thickness would be on the order of 1 nm to 5 nm.

The non-conducting region 176 may be formed by conformally depositing or growing a dielectric material, followed by a CMP or etch steps. The non-conducting region 176 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the non-conducting region 176 may include one or more layers. In an embodiment, the non-conducting region 176 may include any dielectric material such as silicon oxide, silicon oxynitride, silicon nitride, SiBCN, SiOC, low-k dielectric or any combination of these materials.

In an alternate embodiment, the non-conducting region 176 is a DE/FE stack deposition. As mentioned previously, DE/FE (or FE/DE) means a dielectric/ferroelectric (or ferroelectric/dielectric) stack. In this case, the DE thickness would be as described in paragraph 103 while the FE thickness can be on the order of 2 nm to 20 nm. This all depends on the size of the opening 172. Smaller openings would require thinner DE and FE films.

There is a regime of operation of the FE material which can be described as having a negative capacitance. If a DE material is placed in series with a FE material, and if the DE and FE capacitances are appropriately "matched," then the internal voltage at the DE/FE interface is amplified relative to the externally applied voltage. As viewed between the external terminals, this results in a larger capacitance than what otherwise would be inferred from the thicknesses and dielectric constants of the DE and FE layers.

The non-conducting region 176 is the non-conducting material between an inner and an outer electrode of the capacitor. It can either be just a dielectric such as SiO2, or it can be a series DE/FE combination, such as $SiO_2$/HZO, or it can be a series DE/AFE combination, such as $SiO_2$/HZO. AFE stands for antiferroelectric. HZO (Hafnium Zirconium Oxide) can exhibit either FE or AFE properties depending on how much zirconium is present in the material.

The OPL 170 may be selectively removed by a combination of wet/dry etch, such that the protective cap 168, the non-conductive region 176, and the substrate 102 underneath the OPL 170 may remain substantially unetched.

Figure 12:
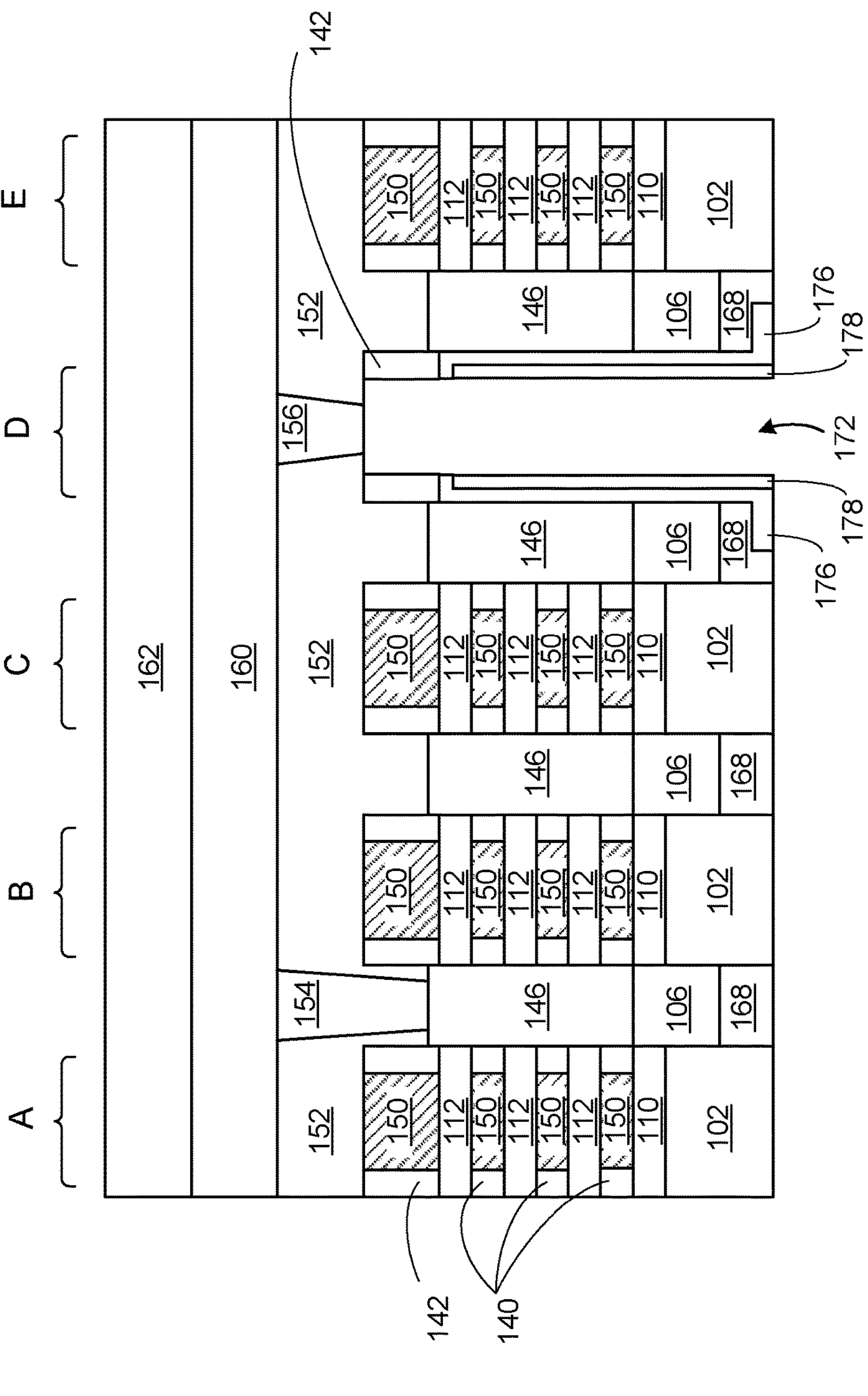
FIG. 12 illustrates a cross-sectional view of the semiconductor structure, and illustrates formation of an inner spacer, according to an embodiment.

Referring now to FIG. 12, the structure 100 is shown according to an exemplary embodiment. An inner spacer 178 may be formed. A portion of the non-conducting region 176 may be removed. The replacement gate 150 in the nanosheet D may be removed.

The inner spacer 178 may be conformally formed in the opening 172, partially filling the opening 172. The inner spacer 178 may have a vertical side surface directly adjacent to the non-conducting region 176. An upper horizontal surface of the inner spacer 178 may be directly adjacent to the non-conducting region 176.

The inner spacer 178 would typically be a nitride layer (e.g., silicon nitride) or possibly an amorphous or polycrystalline Si layer. In either case, it would be formed by CVD. This is an offset spacer to allow for etching through region 176, in order for the inner electrode 182 to access a contact 156. Because the structure is flipped upside-down, to the inner electrode 182, the contact 156 maybe a backside contact 156. This inner spacer 178 would be formed solely for this purpose and then may generally be removed (selectively with a wet etch) after the replacement metal gate 150 is removed. Optionally, the inner spacer 178 may be kept as a dielectric layer for a capacitor to be formed hereafter.

The opening 172 may be further increased by an anisotropic etching technique, such as, for example, reactive ion etching (RIE), removing aligned portions of the replacement metal gate 150 and portions of the channel layers 112 in the nanosheet D, and stopping on etching a portion of the second contact 156 and the ILD 152 above the uppermost channel layer 112 in the nanosheet.

An upper horizontal surface of the opening 172 may be defined by the second contact 156 and the ILD 152 in the nanosheet D. Vertical side surfaces of the opening 172 may be defined by the gate side spacers 142, the non-conducting region 176 and the inner spacer 178, all in the nanosheet D. It is noted here that the inner spacer 178, in one embodiment, may be removed to expose the underneath non-conducting region 176.

Figure 13:
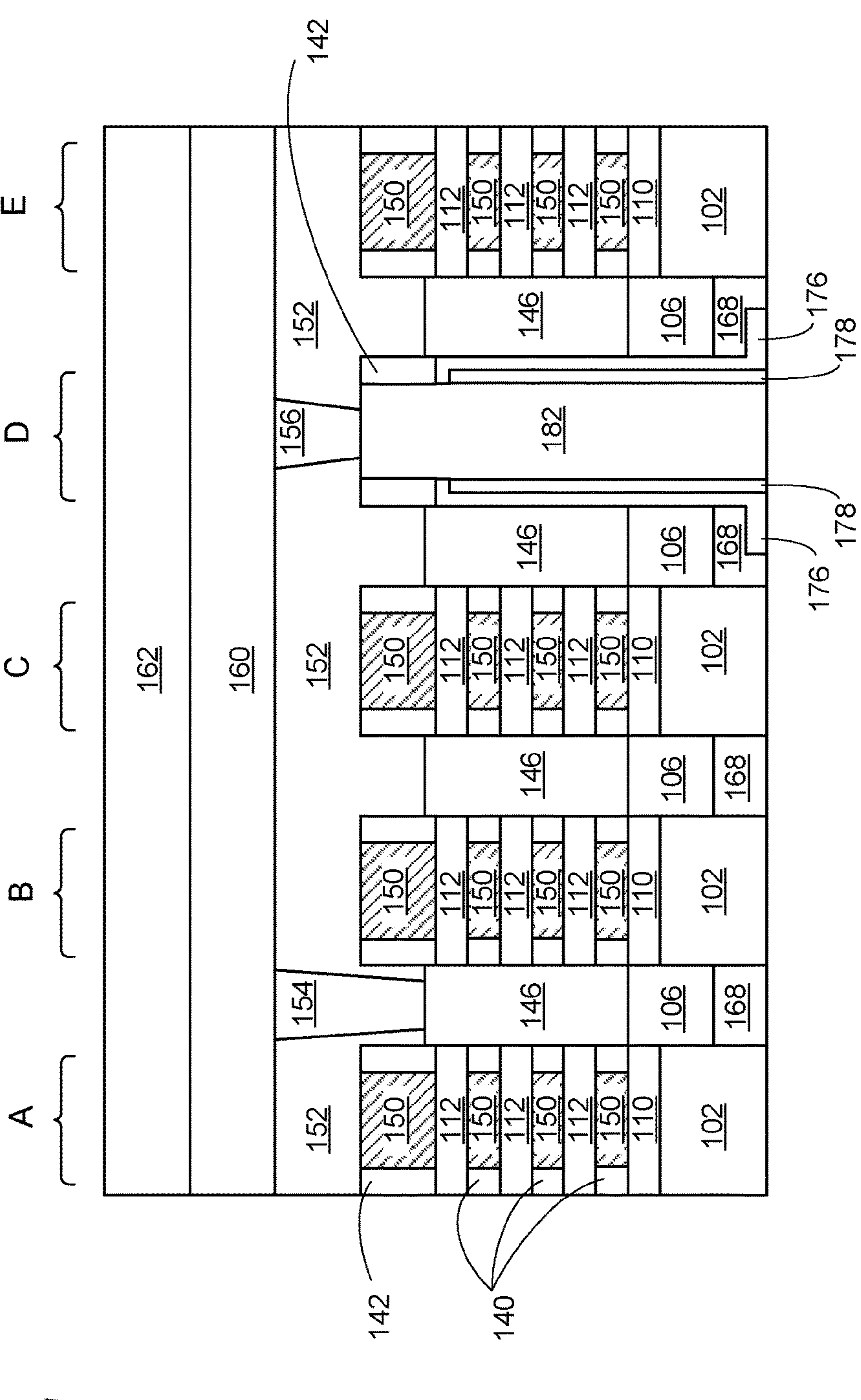
FIG. 13 illustrates a cross-sectional view of the semiconductor structure, and illustrates formation of a metal electrode, according to an embodiment.

Referring now to FIG. 13, the structure 100 is shown according to an exemplary embodiment. A metal electrode 182 may be formed.

The metal electrode 182 is formed in the opening 172, filling the opening 172. An upper horizontal surface of the metal electrode 182 may be defined by the second contact 156 and the ILD 152 in the nanosheet D. Vertical side surfaces of the metal electrode 182 may be defined by the gate side spacers 142, the non-conducting region 176 and the inner spacer 178, all in the nanosheet D.

The metal electrode 182 may be formed by methods known in the arts. The metal electrode 182 may have more than one layer. The metal electrode 182 may include a silicide liner such as Ti, Ni, NiPt, an adhesion liner, such as TiN and a conductive metal, such as W, Co, Ru, or Mo. A chemical mechanical polishing (CMP) technique may be used to remove excess material and polish lower surfaces of the structure 100, exposing a lower horizontal surface of the metal electrode 182 and lower horizontal surfaces of the inner spacer 178 and the non-conducting region 176. The metal electrode 182 forms a connection to the contact 156, which is a contact to a frontside metal gate and the BEOL 160.

Normally, contact 156 would connect to a frontside portion of a metal gate. However, since we are "breaking" this region with a backside etch, contact 156 ends up directly connecting to electrode 182.

Figure 14:
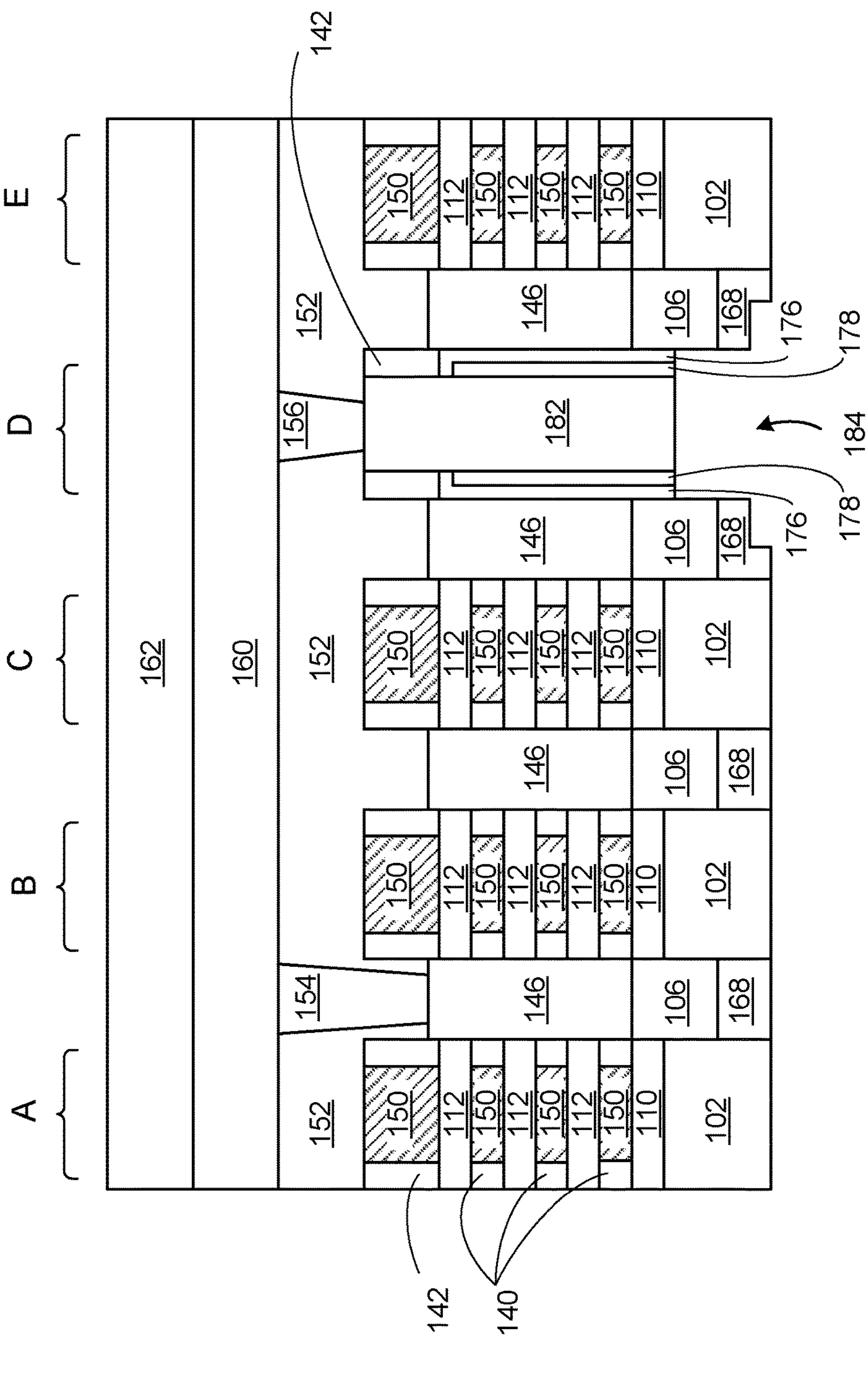
FIG. 14 illustrates a cross-sectional view of the semiconductor structure, and illustrates formation of an opening, according to an embodiment.

Referring now to FIG. 14, the structure 100 is shown according to an exemplary embodiment. An opening 184 may be formed.

The opening 184 may be formed by dry and wet isotropic etch and recessing steps, selective removing of portions of the metal electrode 182, the inner spacer 178 and the non-conducting region 176, selective to the protection cap 168 and the sacrificial placeholder 106, in the nanosheet D.

An upper horizontal surface of the opening 184 may be defined by the metal electrode 182, the inner spacer 178 and the non-conducting region 176 in the nanosheet D. Vertical side surfaces of the opening 184 may be defined by the sacrificial placeholder 106 and the protection cap 168. A second upper horizontal surface of the opening 184 may be defined by the protection cap 168.

Figure 15:
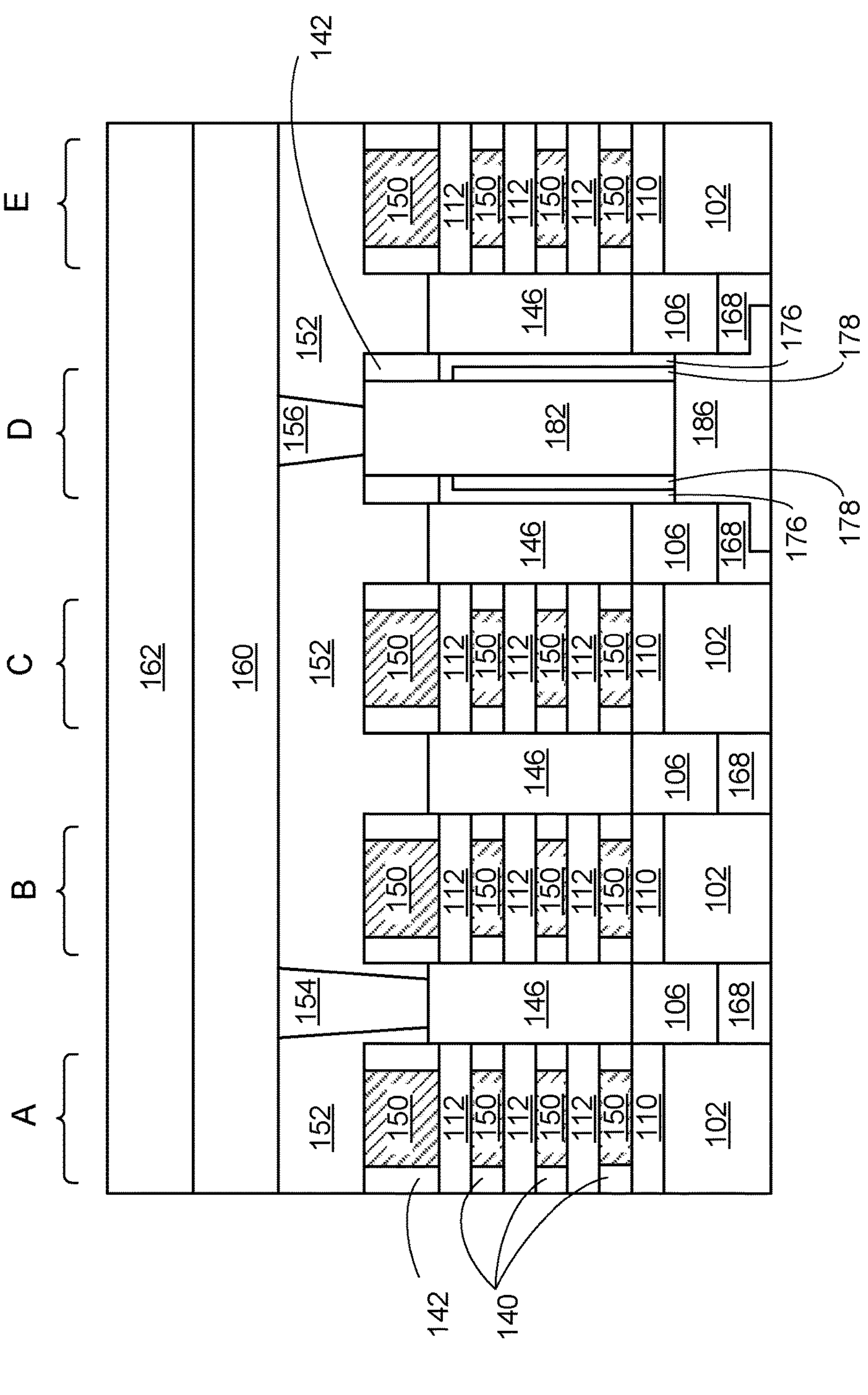
FIG. 15 illustrates a cross-sectional view of the semiconductor structure, and illustrates formation of a dielectric cap, according to an exemplary embodiment.

Referring now to FIG. 15, the structure 100 is shown according to an exemplary embodiment. A dielectric cap 186 may be formed in the opening 184.

The dielectric cap 186 may be formed as described for the ILD 152. A chemical mechanical polishing (CMP) technique may be used to remove excess material of the ILD 168 from a lower horizontal surface of the substrate 102 such that the dielectric cap 186, the protection cap 168 and the substrate 102 are coplanar.

Figure 16:
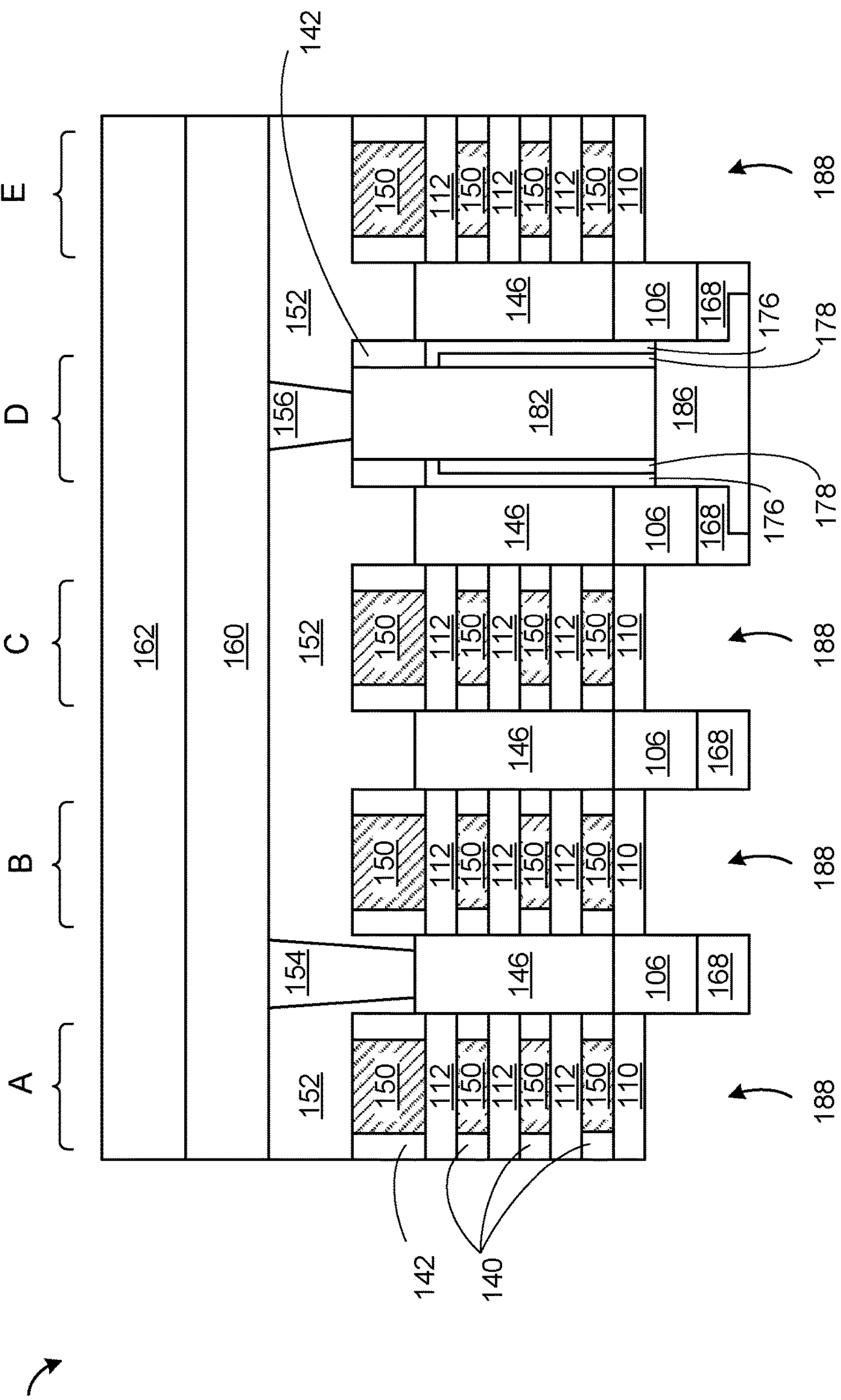
FIG. 16 illustrates a cross-sectional view of the semiconductor structure, and illustrates removal of remaining portions of the substrate, according to an embodiment.

Referring now to FIG. 16, the structure 100 is shown according to an exemplary embodiment. The remaining portions of the substrate 102 may be removed.

The remaining portions of the upper portion of the substrate 102 (which were above the etch stop layer 104) are removed using a combination of processes steps, such as wafer grinding, CMP, RIE and wet etch process, forming an opening 188.

The opening 188 is formed below the nanosheet stacks A, B, C, E. An upper horizontal surface of the opening 188 is defined by a lower horizontal surface of the BDI 110. Vertical side surfaces of the opening 188 are defined by vertical side surfaces of the sacrificial placeholder 106 and the protection cap.

Below the nanosheet stack D, the dielectric cap 186 remains and is not removed.

Figure 17:
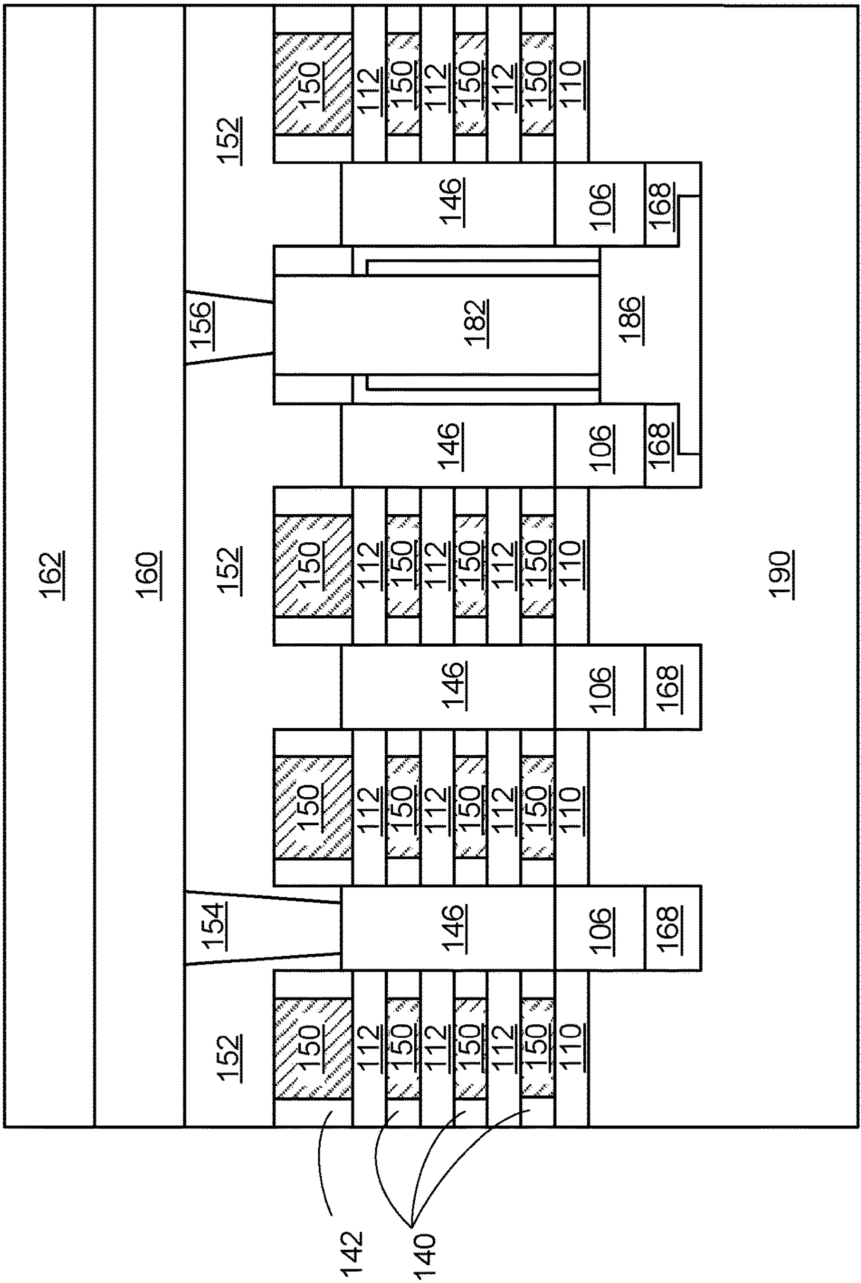
FIG. 17 illustrates a cross-sectional view of the semiconductor structure, and illustrates formation of an inter-layer dielectric, according to an embodiment.
Figure 17:

Referring now to FIG. 17, the structure 100 is shown according to an exemplary embodiment. An interlayer dielectric (hereinafter "ILD") 190 may be formed.

The ILD 190 may be formed on a lower surface of the structure 100. The ILD 190 may be formed as described for the ILD 152. The ILD 190 may fill the opening 188.

Figure 18:
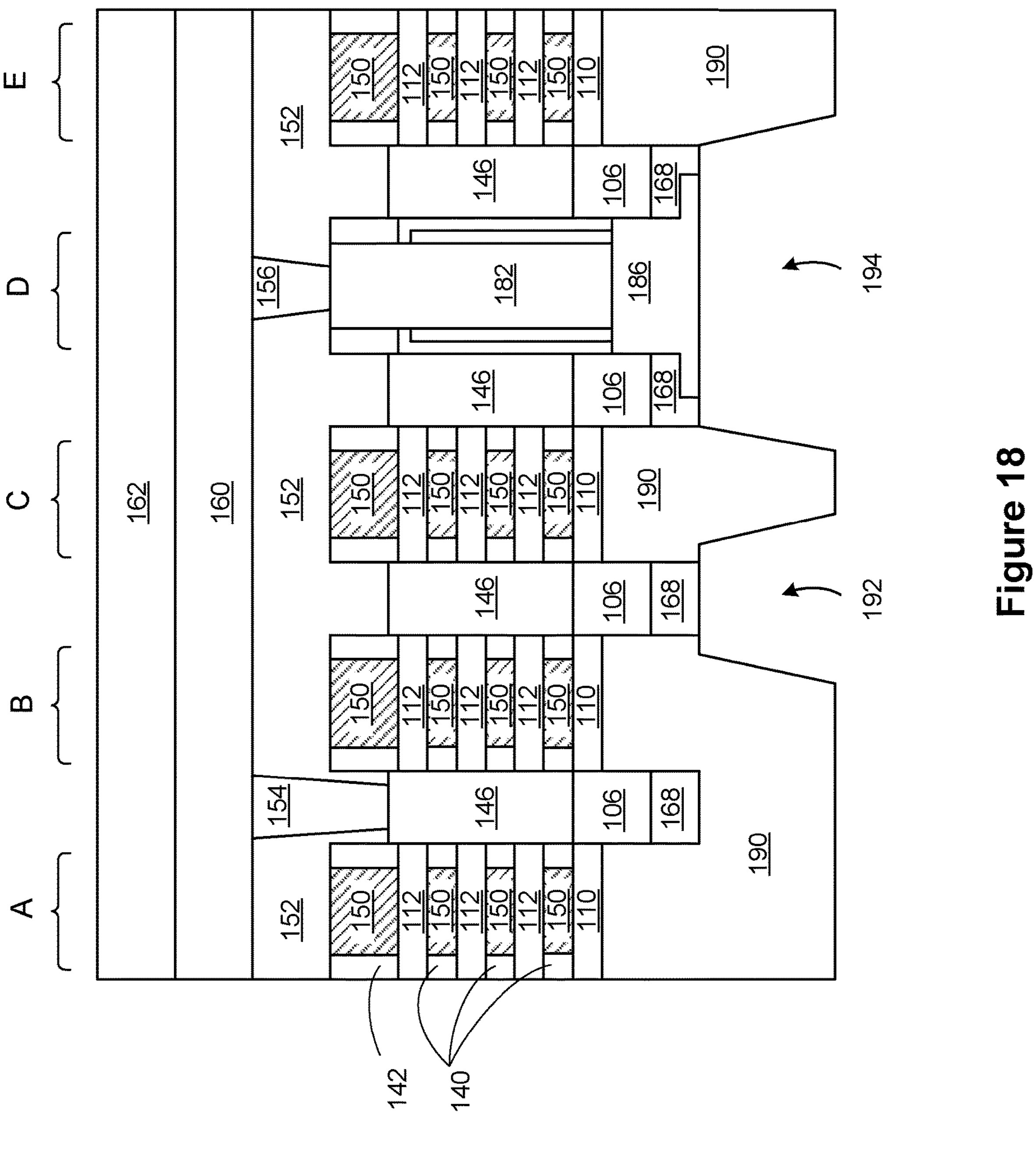
FIG. 18 illustrates a cross-sectional view of the semiconductor structure, and illustrates formation of an opening, according to an embodiment.

Referring now to FIG. 18, the structure 100 is shown according to an exemplary embodiment. An opening 192 and an opening 194 may be formed.

The openings 192, 194 may be formed by methods known in the arts, such as patterning a mask (not shown) and selective removal of portions of the ILD 190.

The opening 192 is formed and provides an opening which exposes a lower horizontal surface of the protection cap 168 below the sacrificial placeholder 106 below the source drain 146 between the nanosheets B, C.

The opening 194 is formed exposing a lower horizontal surface of the dielectric cap 186 and a lower horizontal surface of the protection cap 168. The opening 194 is below the dielectric cap 186 and the protection cap 168, the protection cap 168 is below both the sacrificial placeholder 106 below the source drain 146 between the nanosheets C, D and the sacrificial placeholder 106 below the source drain 146 between the nanosheets D, E.

Figure 19:
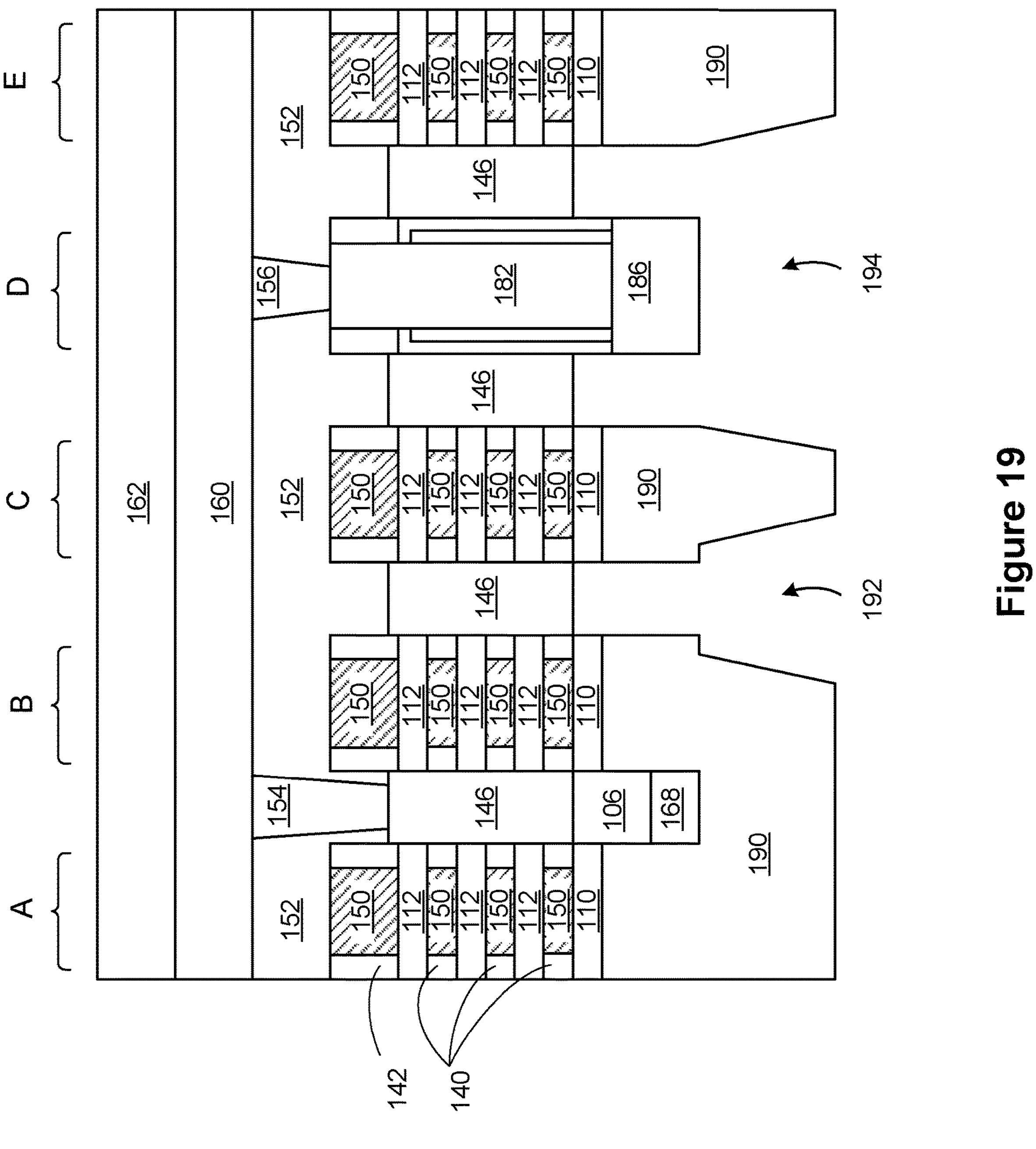
FIG. 19 illustrates a cross-sectional view of the semiconductor structure, and illustrates increasing the opening, according to an embodiment.

Referring now to FIG. 19, the structure 100 is shown according to an exemplary embodiment. The opening 192 and the opening 194 may each be increased.

The opening 192 may be further increased by an anisotropic etching technique, such as, for example, reactive ion etching (RIE), removing the protection cap 168 and the sacrificial placeholder 106 below the source drain between nanosheet stacks B,C. A lower horizontal surface of the source drain 146 between the nanosheet stacks B,C forms an upper surface of the opening 192. Vertical side surfaces of the BDI 110 and the ILD 190 below both the nanosheet stacks B,C form vertical side surfaces of the opening 192.

The opening 194 may be further increased by an anisotropic etching technique, such as, for example, reactive ion etching (RIE), removing the dielectric cap 186, the protection cap 168 and the sacrificial placeholder 106 below the source drain between nanosheet stacks C,D, and removing the protection cap 168 and the sacrificial placeholder 106 below the source drain between nanosheet stacks D,E. A lower horizontal surface of the source drain 146 between the nanosheet stacks C,D forms a first upper surface of the opening 194. Vertical side surfaces of the BDI 110 and the ILD 190 below both the nanosheet stacks C,D form vertical side surfaces of a portion of the opening 194. A lower horizontal surface of the source drain 146 between the nanosheet stacks D,E forms a second upper surface of the opening 194. Vertical side surfaces of the BDI 110 and the ILD 190 below both the nanosheet stacks D,E form vertical side surfaces of a second portion of the opening 194.

The opening 194 is large because we want to strap both source/drain regions together with a single contact, as they both combine to form the outer electrode of the capacitor.

Figure 20:
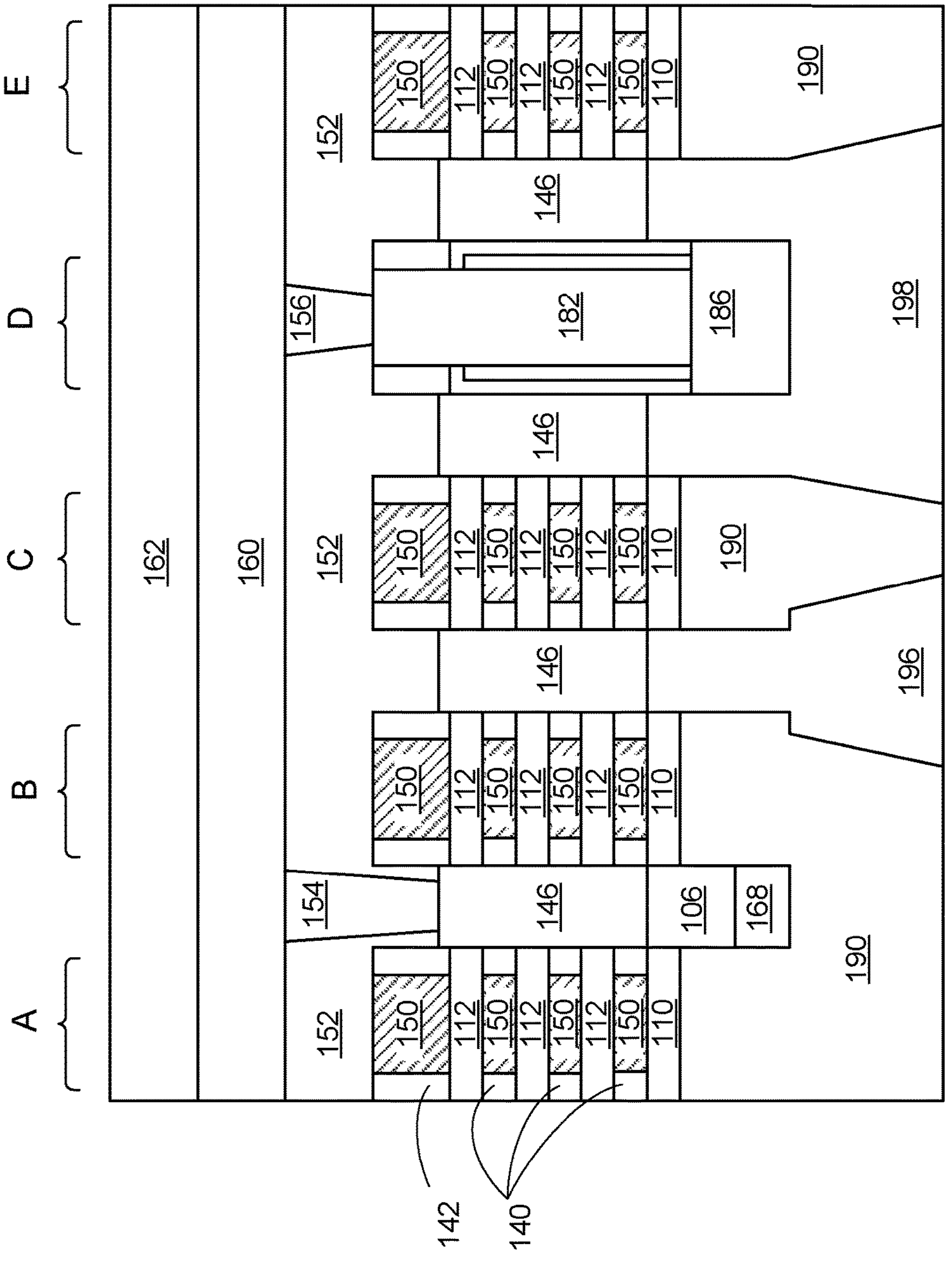
FIG. 20 illustrates a cross-sectional view of the semiconductor structure and illustrates forming a contact, according to an embodiment.

Referring now to FIG. 20, the structure 100 is shown according to an exemplary embodiment. A contact 196 and a contact 198 may be formed.

The contacts 196, 198 may be formed by methods known in the arts. The contacts 196, 198 may have more than one layer. The contacts 196, 198 may include a silicide liner such as Ti, Ni, NiPt, an adhesion liner, such as TiN and a conductive metal, such as W, Co, Ru, or Mo. A chemical mechanical polishing (CMP) technique may be used to remove excess material and polish lower surfaces of the structure 100, exposing a lower horizontal surface of the ILD 190 and lower horizontal surfaces of the contacts 196, 198. The contact 196 forms a contact to the source drain 146 between the nanosheet stacks B,C. The contact 198 forms a contact to the source drain 146 between the nanosheet stacks C,D and to the source drain 146 between the nanosheet stacks D,E. The contact 198 straddles on the dielectric cap 186 in contacting the source drain 146 at the two sides of the inner electrode 182 via the non-conducting region 176.

A capacitor has been formed where the nanosheet stack D was removed. The capacitor has an inner electrode, which is the metal electrode 182 connected to the contact 156, which is a connected to the BEOL 160. The non-conducting region 176 surrounding both sides of the inner electrode. The outer electrode of the capacitor includes both the source drain 146 between the nanosheet stacks C,D and the source drain 146 between the nanosheet stacks D,E. In other words, while being source drain of their respective nanosheet transistors, the source drain 146 between the nanosheet stacks C,D and the source drain 146 between the nanosheet stacks D,E also serve as an outer electrode of the capacitor being formed. The contact 198 contacts the outer electrode of the capacitor In an embodiment, the BEOL 160 includes several layers and the contacts 154, 156 each connect to a different layer within the BEOL 160.

The capacitor is within the nanosheet stacks A,B,C,D,E and helps to reduce power rail noise. The capacitor may be referred to as a trench capacitor formed from a backside through a single diffusion break region. The diffusion break is the removal of the channel layers 112, the replacement gate 150 and the BDI 110 in the nanosheet D.

In an embodiment, the non-conducting region 176 are dielectrics. In an alternate embodiment, the non-conducting region 176 includes a series stack of a dielectric and ferroelectric material, or a dielectric and antiferroelectric material, which would enhance the capacitance between the inner and outer electrodes.

An embodiment where the first source drain region and the second source drain region form an outer electrode of the capacitor. An embodiment including a first non-conducting region sandwiched between the inner electrode and the first source drain region and a second non-conducting region sandwiched between the inner electrode and the second source drain region. An embodiment where the first non-conducting region and the second non-conducting region each comprise one or a combination of a dielectric layer, a ferroelectric layer, and an antiferroelectric layer. An embodiment including a backside contact to the inner electrode. An embodiment including a contact to the first source drain region and the second source drain region. An embodiment including a dielectric cap below the inner electrode.

According to an embodiment, a semiconductor device is provided. The semiconductor device including a first source drain region directly adjacent to a first nanosheet stack, a second source drain region directly adjacent to a second nanosheet stack and an inner electrode of a capacitor between the first source drain region and the second source drain region.

An embodiment where wherein the first source drain region and the second source drain region form an outer electrode of the capacitor. An embodiment including a second non-conducting layer sandwiched between the inner electrode and the second source drain region. An embodiment including a backside contact to the inner electrode. An embodiment including a contact to the first source drain region and the second source drain region.

According to an embodiment, a semiconductor device is provided. The semiconductor device includes a first source drain region directly adjacent to a first nanosheet stack, a second source drain region directly adjacent to a second nanosheet stack, an inner electrode of a capacitor between the first source drain region and the second source drain region, a first liner sandwiched between the inner electrode and the first source drain region and a second liner sandwiched between the inner electrode and the second source drain region.

An embodiment where the first liner and the second liner each comprise one or a combination of a dielectric layer, a ferroelectric layer, and an antiferroelectric layer. An embodiment where the first source drain region and the second source drain region form an outer electrode of the capacitor. An embodiment including a backside contact to the inner electrode. An embodiment including a contact to the first source drain region and the second source drain region. An embodiment including a dielectric cap below the inner electrode.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:

a first source drain region directly adjacent to a first nanosheet stack;

a second source drain region directly adjacent to a second nanosheet stack; and an inner electrode of a capacitor between the first source drain region and the second source drain region.

2. The semiconductor device according to claim 1, wherein the first source drain region and the second source drain region form an outer electrode of the capacitor.

3. The semiconductor device according to claim 1, further comprising:

a first non-conducting region sandwiched between the inner electrode and the first source drain region; and a second non-conducting region sandwiched between the inner electrode and the second source drain region.

4. The semiconductor device according to claim 3, wherein the first non-conducting region and the second non-conducting region each comprise one or a combination of a dielectric layer, a ferroelectric layer, and an antiferroelectric layer.

5. The semiconductor device according to claim 1, further comprising:

a backside contact contacting the inner electrode.

6. The semiconductor device according to claim 1, further comprising:

a contact contacting the first source drain region and the second source drain region.

7. The semiconductor device according to claim 1, further comprising:

a dielectric cap below the inner electrode.

8. A semiconductor device comprising:

a first source drain region directly adjacent to a first nanosheet stack;

a second source drain region directly adjacent to a second nanosheet stack;

an inner electrode of a capacitor between the first source drain region and the second source drain region; and a first non-conducting layer sandwiched between the inner electrode and the first source drain region.

9. The semiconductor device according to claim 8, wherein the first source drain region and the second source drain region form an outer electrode of the capacitor.

10. The semiconductor device according to claim 8, further comprising:

a second non-conducting layer sandwiched between the inner electrode and the second source drain region.

11. The semiconductor device according to claim 8, further comprising:

a backside contact in direct contact with the inner electrode.

12. The semiconductor device according to claim 8, further comprising:

a contact in direct contact with the first source drain region and the second source drain region.

13. The semiconductor device according to claim 8, further comprising:

a dielectric cap below the inner electrode.

14. A semiconductor device comprising:

a first source drain region directly adjacent to a first nanosheet stack;

a second source drain region directly adjacent to a second nanosheet stack;

an inner electrode of a capacitor between the first source drain region and the second source drain region;

a first liner sandwiched between the inner electrode and the first source drain region; and a second liner sandwiched between the inner electrode and the second source drain region.

15. The semiconductor device according to claim 14, wherein the first liner and the second liner each comprise one or a combination of a dielectric layer, a ferroelectric layer, and an antiferroelectric layer.

16. The semiconductor device according to claim 14, wherein the first source drain region and the second source drain region form an outer electrode of the capacitor.

17. The semiconductor device according to claim 14, further comprising:

a backside contact contacting the inner electrode.

18. The semiconductor device according to claim 14, further comprising:

a contact contacting the first source drain region and the second source drain region.

19. The semiconductor device according to claim 18, further comprising:

a dielectric cap below the inner electrode.

20. The semiconductor device according to claim 19, wherein the contact straddles on the dielectric cap.

* * * * *